(12) United States Patent
Kim

(10) Patent No.: US 12,550,403 B2
(45) Date of Patent: Feb. 10, 2026

(54) SEMICONDUCTOR DEVICE

(71) Applicant: Samsung Electronics Co., Ltd., Suwon-si (KR)

(72) Inventor: Sungmin Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 354 days.

(21) Appl. No.: 18/139,985

(22) Filed: Apr. 27, 2023

(65) Prior Publication Data

US 2024/0088264 A1    Mar. 14, 2024

(30) Foreign Application Priority Data

Jul. 27, 2022  (KR) .................. 10-2022-0093012

(51) Int. Cl.
| | |
|---|---|
| *H01L 29/66* | (2006.01) |
| *H01L 29/06* | (2006.01) |
| *H01L 29/08* | (2006.01) |
| *H01L 29/417* | (2006.01) |
| *H01L 29/423* | (2006.01) |
| *H01L 29/775* | (2006.01) |
| *H10D 30/01* | (2025.01) |
| *H10D 30/43* | (2025.01) |
| *H10D 30/67* | (2025.01) |
| *H10D 62/10* | (2025.01) |

(Continued)

(52) U.S. Cl.
CPC ......... *H10D 64/018* (2025.01); *H10D 30/014* (2025.01); *H10D 30/43* (2025.01); *H10D 30/6729* (2025.01); *H10D 30/6735* (2025.01); *H10D 62/121* (2025.01); *H10D 62/151* (2025.01); *H10D 64/017* (2025.01)

(58) Field of Classification Search
CPC .. H10D 30/014; H10D 30/43; H10D 30/6219; H10D 30/6713; H10D 30/6729; H10D 30/6735; H10D 30/797; H10D 62/021; H10D 62/118; H10D 62/119; H10D 62/121; H10D 62/149; H10D 62/151; H10D 64/015; H10D 64/018; H10D 64/021; H10D 84/013; H10D 84/017
See application file for complete search history.

(56) References Cited

U.S. PATENT DOCUMENTS

| | | |
|---|---|---|
| 7,122,431 B2 | 10/2006 | Kim et al. |
| 10,741,639 B2 | 8/2020 | Loubet et al. |

(Continued)

*Primary Examiner* — David C Spalla
(74) *Attorney, Agent, or Firm* — Wolf, Greenfield & Sacks, P.C.

(57) ABSTRACT

Disclosed is a semiconductor device comprising a substrate that comprises an active pattern, a channel pattern on the active pattern and comprising a plurality of semiconductor patterns that are spaced apart from and vertically stacked on each other, a source/drain pattern electrically connected to the plurality of semiconductor patterns, a gate electrode on the plurality of semiconductor patterns and comprising a plurality of electrodes that are respectively below respective ones of the plurality of semiconductor patterns, the plurality of electrodes comprising a lowermost first electrode and a second electrode on the first electrode, and a first spacer between the first electrode and the source/drain pattern, wherein a horizontal width of the first electrode is less than a horizontal width of the second electrode.

19 Claims, 32 Drawing Sheets

(51) Int. Cl.
*H10D 62/13* (2025.01)
*H10D 64/01* (2025.01)

(56) References Cited

U.S. PATENT DOCUMENTS

| | | |
|---|---|---|
| 10,916,629 B2 | 2/2021 | Reznicek et al. |
| 11,056,570 B2 | 7/2021 | Xie et al. |
| 11,069,681 B2 | 7/2021 | Shin et al. |
| 11,227,917 B1 | 1/2022 | Chung et al. |
| 2017/0256609 A1* | 9/2017 | Bhuwalka ............... H10D 30/43 |
| 2021/0035870 A1 | 2/2021 | Young et al. |
| 2021/0043727 A1 | 2/2021 | Frougier et al. |
| 2021/0126099 A1* | 4/2021 | Young ................. H10D 64/017 |
| 2021/0202697 A1* | 7/2021 | Young ................. H10D 84/038 |
| 2022/0301936 A1* | 9/2022 | Merchant ............. H10D 62/121 |
| 2023/0122339 A1* | 4/2023 | Lin ...................... H10D 62/121 |
| | | 257/288 |

* cited by examiner

SEMICONDUCTOR DEVICE

CROSS-REFERENCE TO RELATED APPLICATION

This U.S. nonprovisional application claims priority under 35 U.S.C § 119 to Korean Patent Application No. 10-2022-0093012 filed on Jul. 27, 2022 in the Korean Intellectual Property Office, the disclosure of which is hereby incorporated by reference in its entirety.

BACKGROUND

The present inventive concepts relate to a semiconductor device, and more particularly, to a semiconductor device including a field effect transistor and a method of fabricating the same.

A semiconductor device may include an integrated circuit including metal oxide semiconductor field effect transistors (MOSFETs). As sizes and design rules of the semiconductor device are gradually decreased, sizes of the MOSFETs are also increasingly scaled down. The scaling down of MOSFETs may deteriorate operating characteristics of the semiconductor device. Accordingly, various studies have been conducted to develop methods of fabricating semiconductor devices having superior performances while overcoming limitations caused by high integration of the semiconductor devices.

SUMMARY

Some embodiments of the present inventive concepts provide a semiconductor device with increased reliability and improved electrical properties.

Some embodiments of the present inventive concepts provide a method of fabricating a semiconductor device with increased reliability and improved electrical properties.

According to some embodiments of the present inventive concepts, a semiconductor device may comprise: a substrate that comprises an active pattern; a channel pattern on the active pattern, the channel pattern comprising a plurality of semiconductor patterns that are spaced apart from and vertically stacked on each other; a source/drain pattern electrically connected to the plurality of semiconductor patterns; a gate electrode on the plurality of semiconductor patterns, the gate electrode comprising a plurality of electrodes that are respectively below respective ones of the plurality of semiconductor patterns, the plurality of electrodes comprising a lowermost first electrode and a second electrode on the first electrode; and a first spacer between the first electrode and the source/drain pattern, wherein a horizontal width of the first electrode is less than a horizontal width of the second electrode.

According to some embodiments of the present inventive concepts, a semiconductor device may comprise: a substrate that comprises an active pattern; a channel pattern on the active pattern, the channel pattern comprising a plurality of semiconductor patterns that are spaced apart from and vertically stacked on each other; a source/drain pattern electrically connected to the plurality of semiconductor patterns; a gate electrode on the plurality of semiconductor patterns, the gate electrode comprising a plurality of electrodes that are respectively below respective ones of the plurality of semiconductor patterns; a gate dielectric layer that is on each of the plurality of electrodes; and a spacer between the source/drain pattern and a lowermost one of the plurality of electrodes, wherein a portion of the gate dielectric layer that is on remaining ones of the plurality of electrodes other than the lowermost electrode may be in contact with the source/drain pattern, and wherein a portion of the gate dielectric layer that is on the lowermost electrode may be in contact with the spacer.

According to some embodiments of the present inventive concepts, a semiconductor device may comprise: a substrate that comprises an active region; a device isolation layer that defines an active pattern on the active region; a channel pattern and a source/drain pattern on the active pattern, the channel pattern comprising a plurality of semiconductor patterns that are spaced apart from and vertically stacked on each other; a gate electrode on the plurality of semiconductor patterns, the gate electrode comprising a plurality of inner electrodes that are respectively below respective ones of the plurality of semiconductor patterns and an outer electrode on an uppermost one of the plurality of semiconductor patterns, the plurality of inner electrodes comprising a lowermost first inner electrode and a second inner electrode on the first inner electrode; a gate dielectric layer between the gate electrode and the respective ones of the plurality of semiconductor patterns; an inner spacer between the first inner electrode and the source/drain pattern; a gate spacer on a sidewall of the outer electrode; a gate capping pattern on a top surface of the outer electrode; an interlayer dielectric layer on the gate capping pattern; an active contact that extends into the interlayer dielectric layer and is electrically connected to the source/drain pattern; a gate contact that extends into the interlayer dielectric layer and the gate capping pattern and is electrically connected to the gate electrode; and a first metal layer on the interlayer dielectric layer, the first metal layer comprising a power line and first wiring lines, the first wiring lines being electrically connected to the active contact and the gate contact, respectively; wherein the gate dielectric layer may be on each of the plurality of inner electrodes, wherein a portion of the gate dielectric layer that is on the second inner electrode may be in contact with the source/drain pattern, and wherein a portion of the gate dielectric layer that is on the first inner electrode may be in contact with the inner spacer.

DETAILED DESCRIPTION

Figure 1:
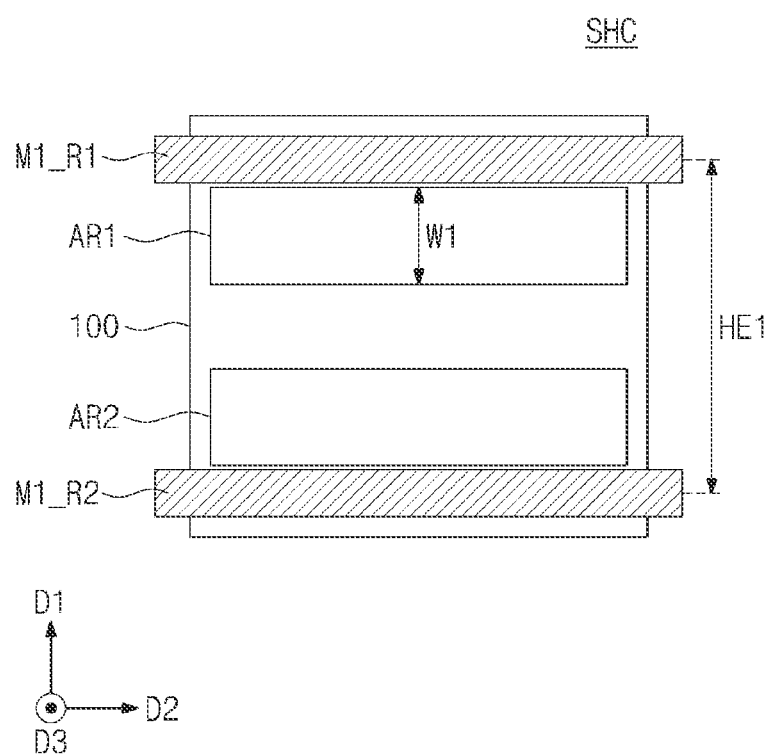
FIGS. 1 to 3 illustrate conceptual views showing logic cells of a semiconductor device according to some embodiments of the present inventive concepts.
Figure 2:
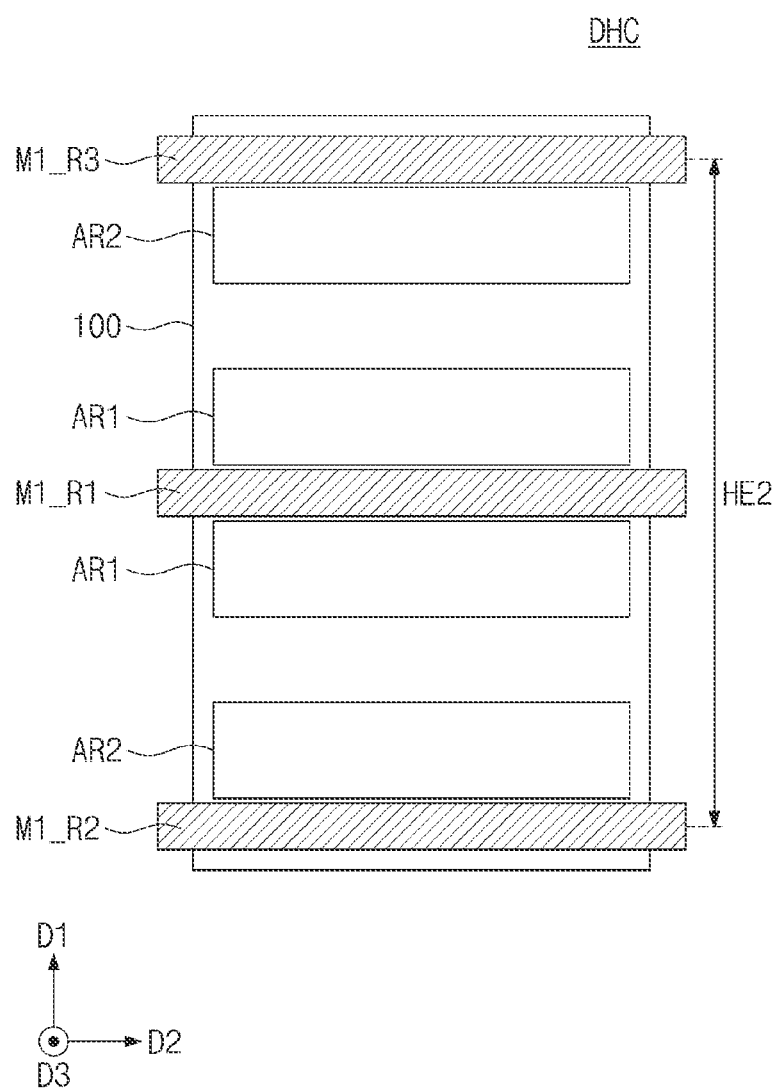
Figure 3:
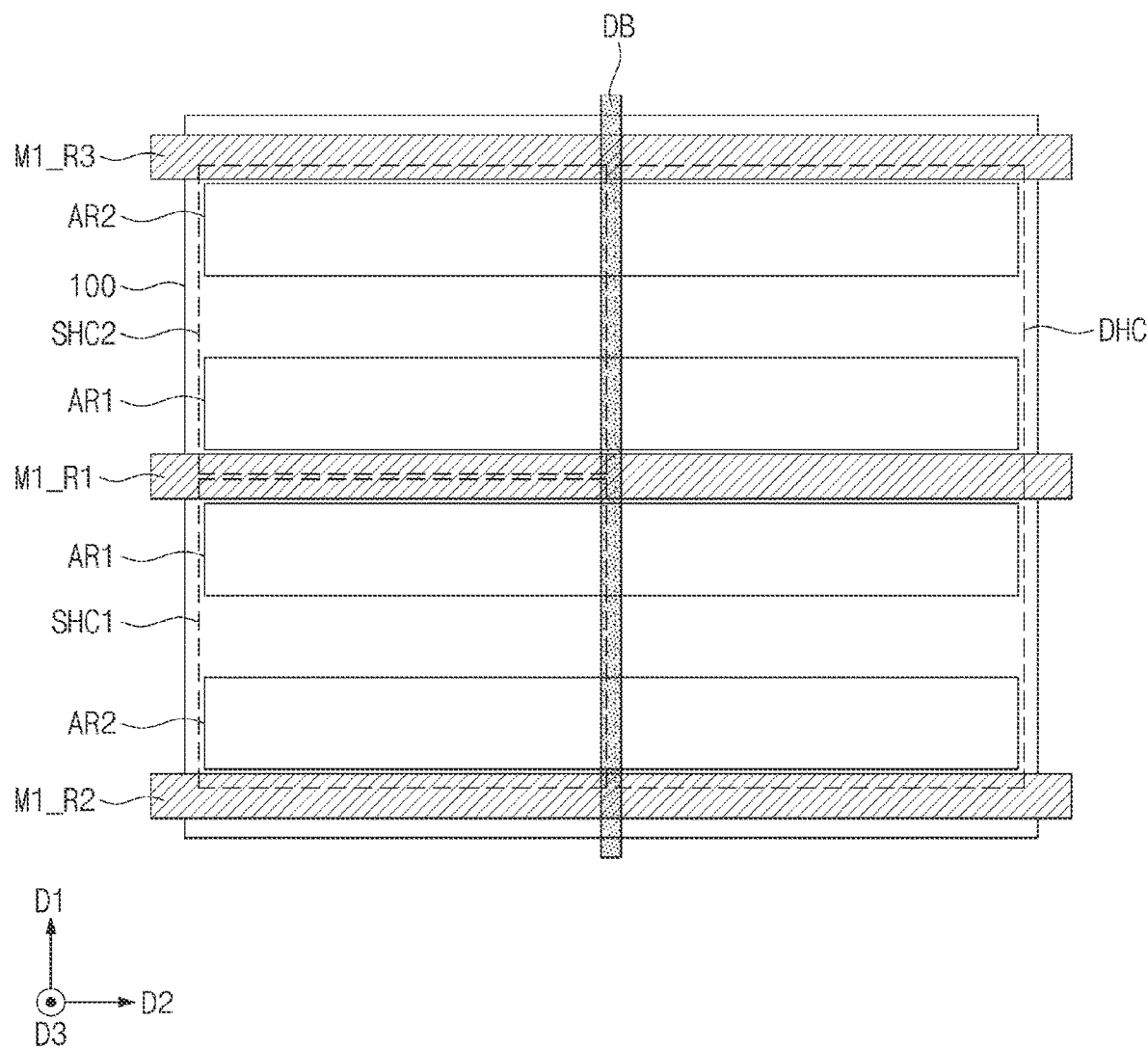

FIGS. 1 to 3 illustrate conceptual views showing logic cells of a semiconductor device according to some embodiments of the present inventive concepts.

Referring to FIG. 1, a single height cell SHC may be provided. For example, a substrate 100 may be provided with a first power line M1_R1 and a second power line M1_R2. The first power line M1_R1 may be a path for providing a source voltage VSS, for example, a ground voltage. The second power line M1_R2 may be a path for providing a drain voltage VDD, for example, a power voltage.

The single height cell SHC may be defined between the first power line M1_R1 and the second power line M1_R2. The single height cell SHC may include one first active region AR1 and one second active region AR2. One of the first and second active regions AR1 and AR2 may be a PMOSFET region, and the other of the first and second active regions AR1 and AR2 may be an NMOSFET region. For example, the single height cell SHC may have a complementary metal oxide semiconductor (CMOS) structure provided between the first power line M1_R1 and the second power line M1_R2.

Each of the first and second active regions AR1 and AR2 may have a first width W1 in a first direction D1. A first height HE1 may be defined to indicate a length in the first direction D1 of the single height cell SHC. The first height HE1 may be substantially the same as a distance (e.g., pitch) between the first power line M1_R1 and the second power line M1_R2.

The single height cell SHC may constitute one logic cell. In this description, the logic cell may mean a logic device, such as AND, OR, XOR, XNOR, and inverter, that performs a specific function. For example, the logic cell may include transistors for constituting a logic device, and may also include wiring lines that connect the transistors to each other.

Referring to FIG. 2, a double height cell DHC may be provided. For example, a substrate 100 may be provided with a first power line M1_R1, a second power line M1_R2, and a third power line M1_R3. The first power line M1_R1 may be disposed between the second power line M1_R2 and the third power line M1_R3. The third power line M1_R3 may be a path for providing a source voltage VSS.

The double height cell DHC may be defined between the second power line M1_R2 and the third power line M1_R3. The double height cell DHC may include two first active regions AR1 and two second active regions AR2.

One of the two second active regions AR2 may be adjacent to the second power line M1_R2. The other of the two second active regions AR2 may be adjacent to the third power line M1_R3. The two first active regions AR1 may be adjacent to the first power line M1_R1. When viewed in plan, the first power line M1_R1 may be disposed between the two first active regions AR1.

A second height HE2 may be defined to indicate a length in the first direction D1 of the double height cell DHC. The second height HE2 may be about twice the first height HE1 of FIG. 1. The two first active regions AR1 of the double height cell DHC may be collectively connected together to act as one active region.

In some embodiments of the present inventive concepts, the double height cell DHC shown in FIG. 2 may be defined as a multi-height cell. Although not shown, the multi-height cell may include a triple height cell whose cell height is about three times that of the single height cell SHC.

Referring to FIG. 3, a substrate 100 may be provided with a first single height cell SHC1, a second single height cell SHC2, and a double height cell DHC that are two-dimensionally disposed. The first single height cell SHC1 may be disposed between a first power line M1_R1 and a second power line M1_R2. The second single height cell SHC2 may be disposed between the first power line M1_R1 and a third power line M1_R3. The second single height cell SHC2 may be adjacent in a first direction D1 to the first single height cell SHC1.

The double height cell DHC may be disposed between the second power line M1_R2 and the third power line M1_R3. The double height cell DHC may be adjacent in a second direction D2 to the first and second single height cells SHC1 and SHC2.

A separation structure DB may be provided between the first single height cell SHC1 and the double height cell DHC and between the second single height cell SHC2 and the double height cell DHC. The separation structure DB may electrically separate an active region of the double height cell DHC from an active region of each of the first and second single height cells SHC1 and SHC2.

Figure 4:
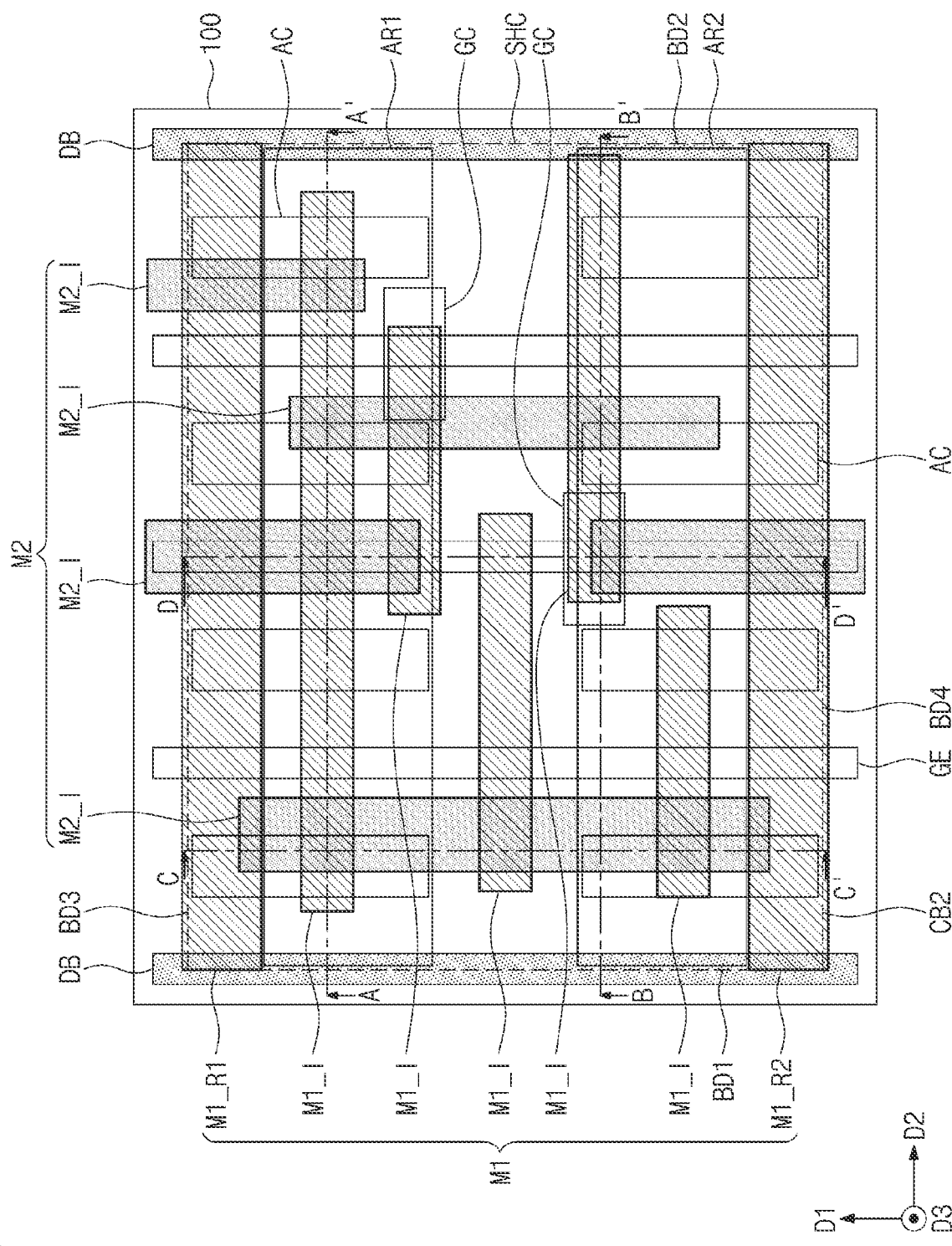
FIG. 4 illustrates a plan view showing a semiconductor device according to some embodiments of the present inventive concepts.
Figure 5A:
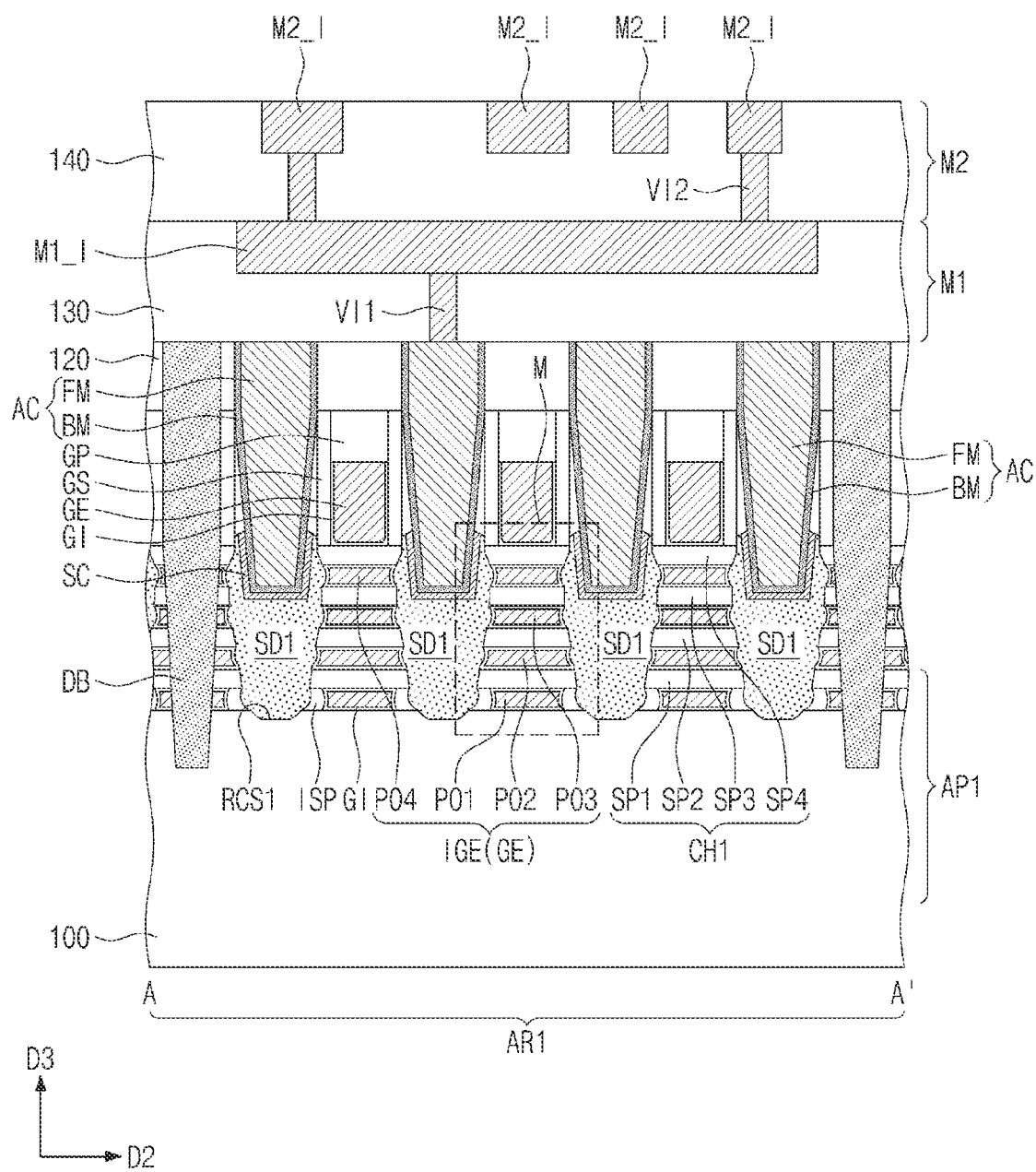
FIGS. 5A, 5B, 5C, and 5D illustrate cross-sectional views respectively taken along lines A-A', B-B', C-C', and D-D' of FIG. 4.
Figure 5B:
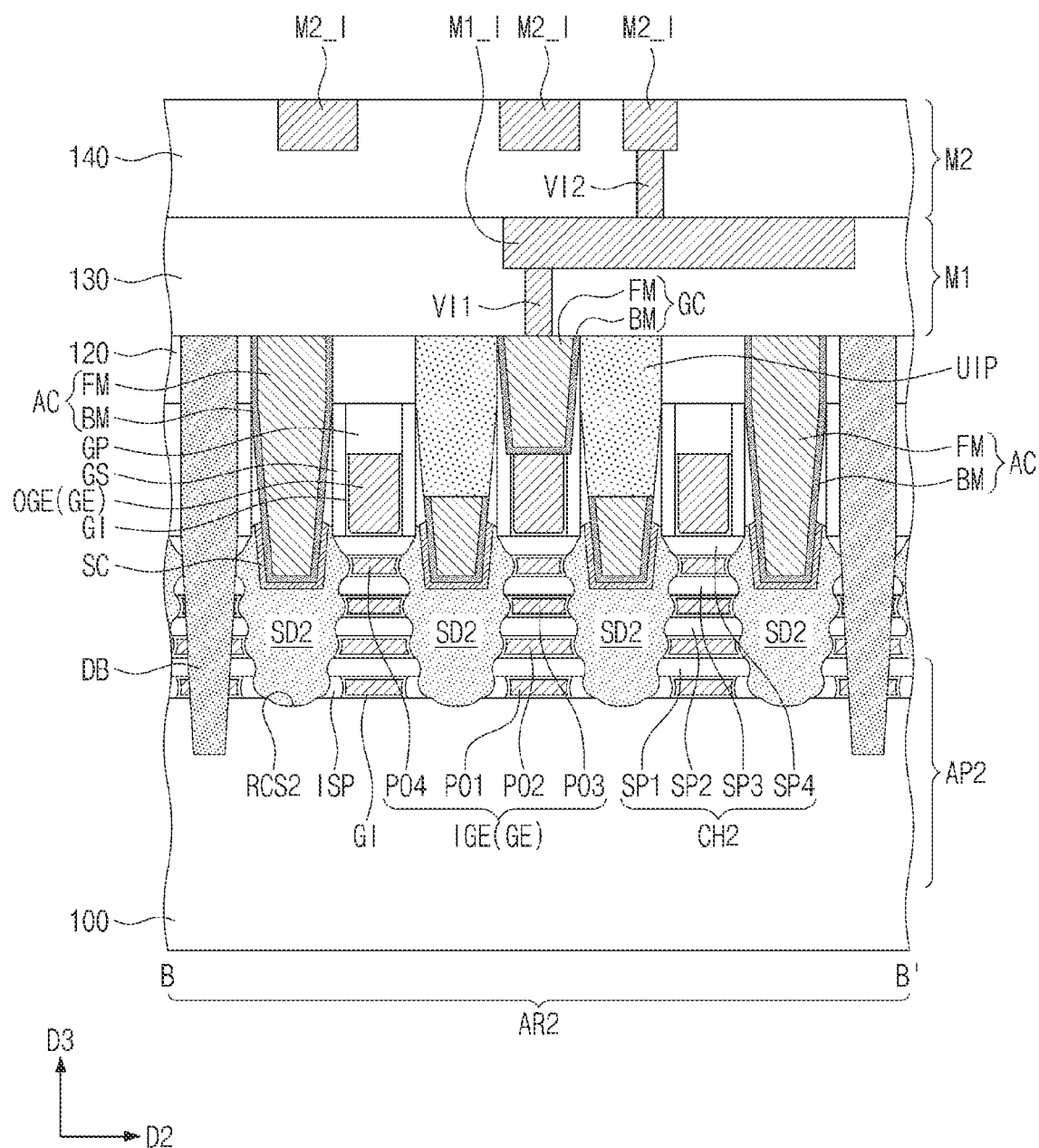
Figure 5C:
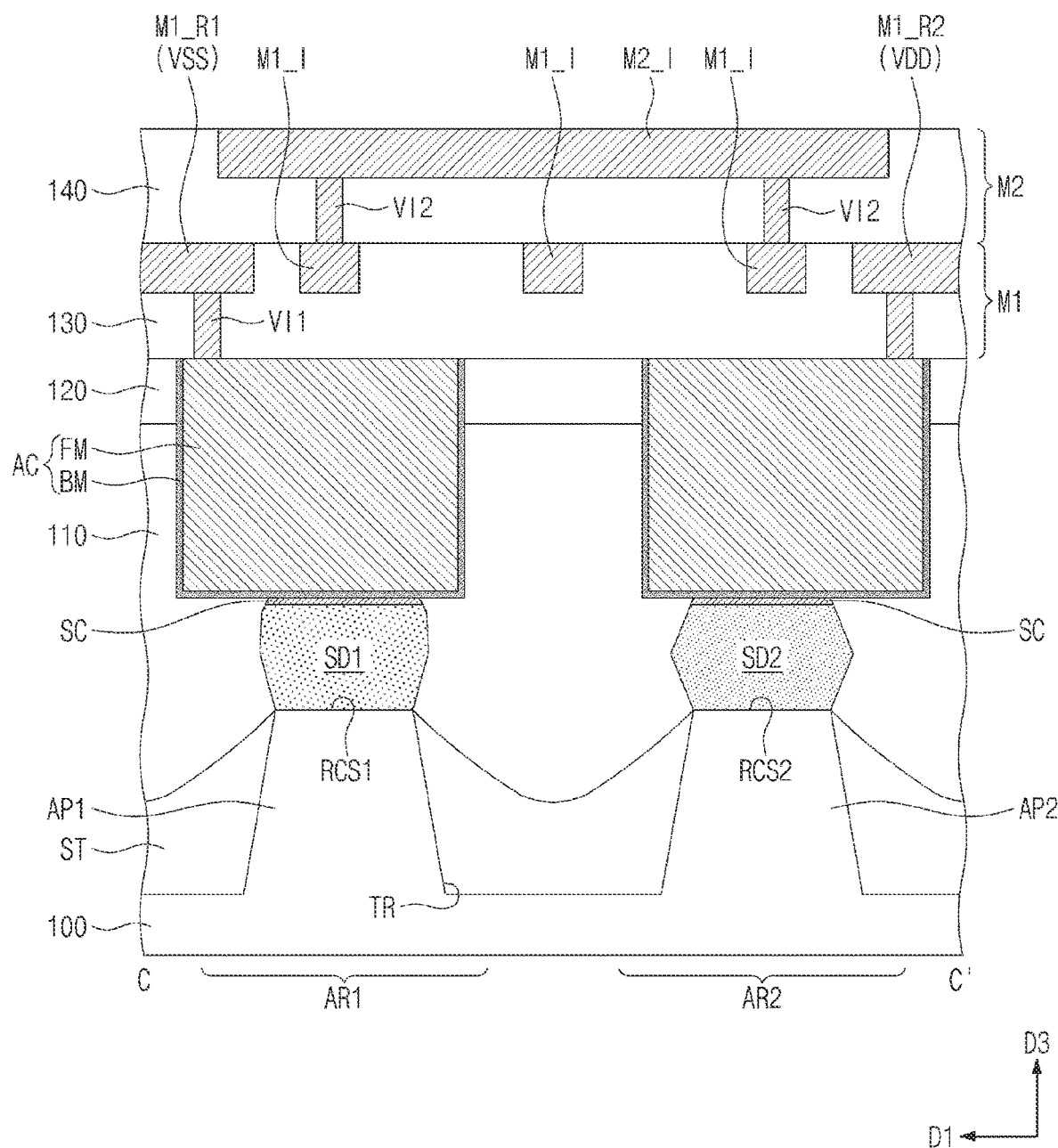

FIG. 4 illustrates a plan view showing a semiconductor device according to some embodiments of the present inventive concepts. FIGS. 5A, 5B, 5C, and 5D illustrate cross-sectional views respectively taken along lines A-A', B-B', C-C', and D-D' of FIG. 4. FIG. 6 illustrates an enlarged view showing an example of a section M depicted in FIG. 5A. A semiconductor device depicted in FIGS. 4 and 5A to 5D is a detailed example of the single height cell SHC shown in FIG. 1.

Referring to FIGS. 4 and 5A to 5D, a single height cell SHC may be provided on a substrate 100. The single height cell SHC may be provided with logic transistors included in a logic circuit. The substrate 100 may be a compound semiconductor substrate or a semiconductor substrate including silicon, germanium, or silicon-germanium. For example, the substrate 100 may be a silicon substrate.

The substrate 100 may include a first active region AR1 and a second active region AR2. Each of the first and second active regions AR1 and AR2 may extend in a second direction D2. In some embodiments, the first active region AR1 may be an NMOSFET region, and the second active region AR2 may be a PMOSFET region, but are not limited thereto.

A first active pattern AP1 and a second active pattern AP2 may be defined by a trench TR formed on an upper portion of the substrate 100. The first active pattern AP1 may be provided on the first active region AR1, and the second active pattern AP2 may be provided on the second active region AR2. The first and second active patterns AP1 and AP2 may extend in the second direction D2. The first and second active patterns AP1 and AP2 may be vertically protruding portions of the substrate 100.

A device isolation layer ST may be provided on the substrate 100. The device isolation layer ST may fill the trench TR. The device isolation layer ST may include a silicon oxide layer. The device isolation layer ST may not cover any of first and second channel patterns CH1 and CH2 which will be discussed below.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, a third semiconductor pattern SP3, and a fourth semiconductor pattern SP4 that are sequentially stacked. The first to fourth semiconductor patterns SP1 to SP4 may be spaced apart from each other in a vertical direction (e.g., a third direction D3).

Each of the first to fourth semiconductor patterns SP1 to SP4 may include silicon (Si), germanium (Ge), or silicon-germanium (SiGe). For example, each of the first to fourth semiconductor patterns SP1 to SP4 may include crystalline silicon, for example, monocrystalline silicon. In some embodiments of the present inventive concepts, the first to fourth semiconductor patterns SP1 to SP4 may be four stacked nano-sheets.

Each of the first and second channel patterns CH1 and CH2 is not limited in the number (e.g., four) of the stacked nano-sheets thereof. In some embodiments of the present inventive concepts, each of the first and second channel patterns CH1 and CH2 may be 2 to 10 stacked nano-sheets. For example, the number of the stacked nano-sheets according to embodiments of the present inventive concepts is not limited, and may be variously changed.

A plurality of first source/drain patterns SD1 may be provided on the first active pattern AP1. A plurality of first recesses RCS1 may be formed on the upper portion of the first active pattern AP1. The first source/drain patterns SD1 may be correspondingly or respectively provided in the first recesses RCS1. The first source/drain patterns SD1 may be impurity regions of a first conductivity type (e.g., n-type). The first channel pattern CH1 may be interposed between a pair of first source/drain patterns SD1. For example, the stacked first to fourth semiconductor patterns SP1 to SP4 may connect (e.g., electrically connect) the pair of first source/drain patterns SD1 to each other.

A plurality of second source/drain patterns SD2 may be provided on the second active pattern AP2. A plurality of second recesses RCS2 may be formed on the upper portion of the second active pattern AP2. The second source/drain patterns SD2 may be correspondingly or respectively provided in the second recesses RCS2. The second source/drain patterns SD2 may be impurity regions of a second conductivity type (e.g., p-type). The second channel pattern CH2 may be interposed between a pair of second source/drain patterns SD2. For example, the stacked first to fourth semiconductor patterns SP1 to SP4 may connect (e.g., electrically connect) the pair of second source/drain patterns SD2 to each other.

The first and second source/drain patterns SD1 and SD2 may be epitaxial patterns formed by a selective epitaxial growth process. For example, each of the first and second source/drain patterns SD1 and SD2 may have a top surface higher than that of the fourth semiconductor pattern SP4. For another example, at least one of the first and second source/drain patterns SD1 and SD2 may have a top surface located at substantially the same height as that of a top surface of the fourth semiconductor pattern SP4.

In some embodiments of the present inventive concepts, the first source/drain patterns SD1 may include the same semiconductor element (e.g., Si) as that of the substrate 100. The second source/drain patterns SD2 may include a semiconductor element (e.g., SiGe) whose lattice constant is greater than that of a semiconductor element of the substrate 100. Therefore, a pair of second source/drain patterns SD2 may provide the second channel pattern CH2 with compressive stress.

In some embodiments of the present inventive concepts, each of the first and second source/drain patterns SD1 and SD2 may have an embossing shape at a sidewall thereof. For example, each of the first and second source/drain patterns SD1 and SD2 may have a wavy profile at a sidewall thereof. The sidewall of each of the first and second source/drain patterns SD1 and SD2 may protrude toward first to fourth inner electrodes PO1-PO4 of a gate electrode GE which will be discussed below. For example, the sidewall of each of the first and second source/drain patterns SD1 and SD2 may have portions that are convex with respect to first to fourth inner electrodes PO1-PO4 of a gate electrode GE. For example, the protrusion degree of the sidewall of the first source/drain pattern SD1 may be less than that of the sidewall of the second source/drain pattern SD2.

The first and second channel patterns CH1 and CH2 may be provided with gate electrodes GE. Each of the gate electrodes GE may extend in a first direction D1, while running across or intersecting the first and second channel patterns CH1 and CH2. Each of the gate electrodes GE may vertically overlap the first and second channel patterns CH1 and CH2. The gate electrodes GE may be arranged in the second direction D2.

The gate electrode GE may include an inner electrode IGE provided within each of the first and second channel patterns CH1 and CH2 and an outer electrode OGE outside the inner electrode IGE. The inner electrode IGE may include a first inner electrode PO1 interposed between the active pattern AP1 and the first semiconductor pattern SP1, a second inner electrode PO2 interposed between the first semiconductor pattern SP1 and the second semiconductor pattern SP2, a third inner electrode PO3 interposed between the second semiconductor pattern SP2 and the third semiconductor pattern SP3, and a fourth inner electrode PO4 interposed between the third semiconductor pattern SP3 and the fourth semiconductor pattern SP4. The number of the stacked inner electrodes PO1 to PO4 may be the same as that of the stacked nano-sheets.

Figure 5D:
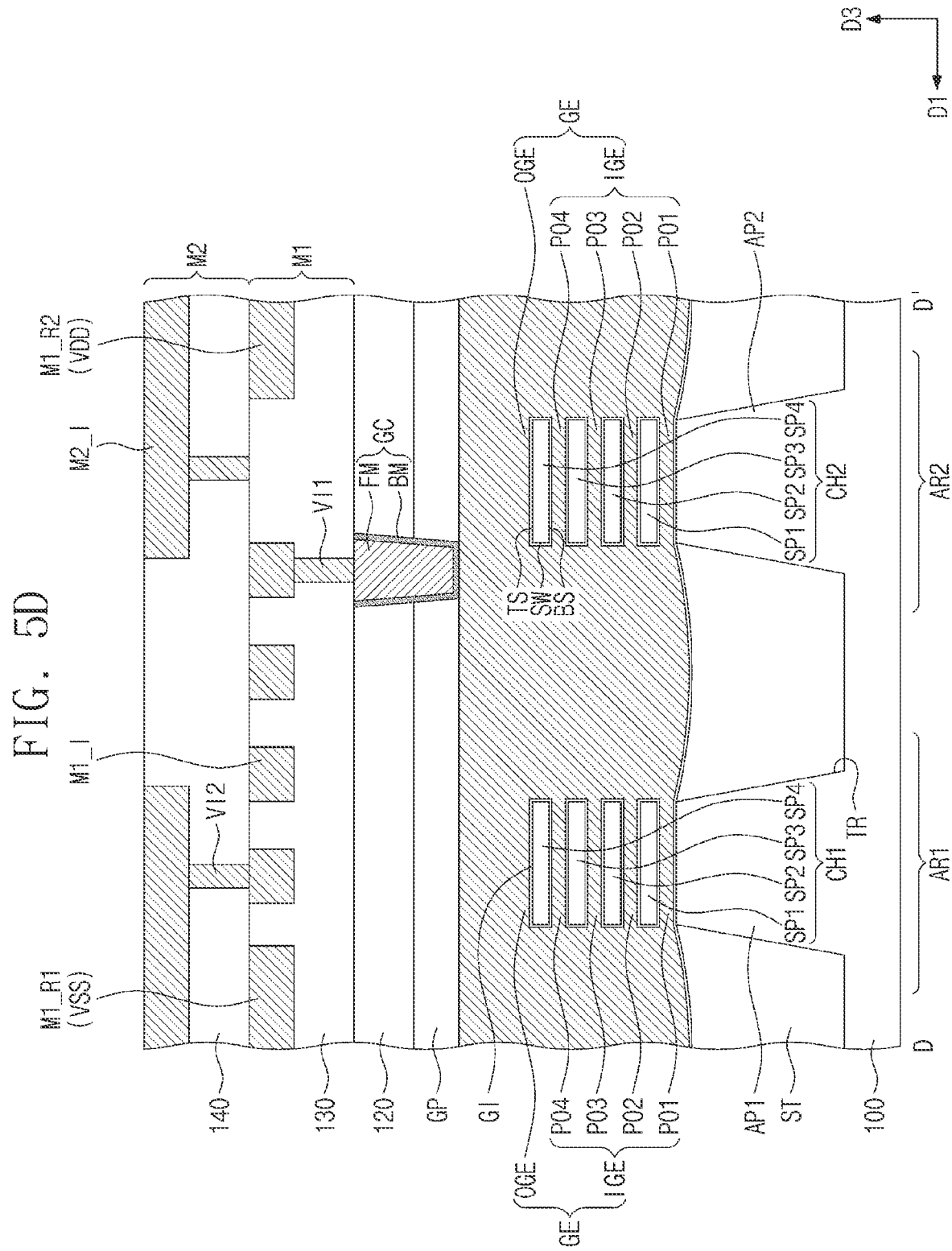
Figure 6:
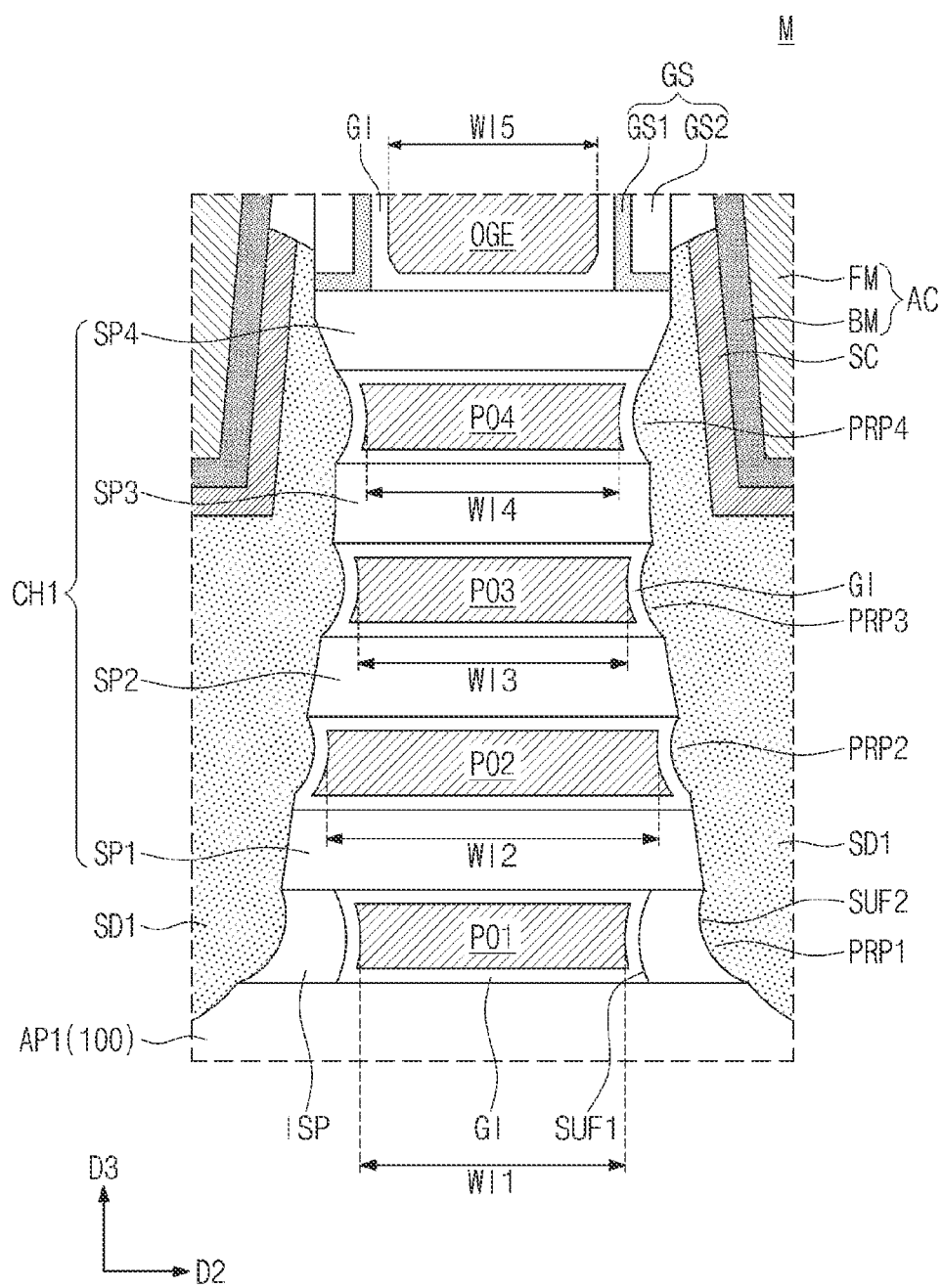
FIG. 6 illustrates an enlarged view showing an example of a section M depicted in FIG. 5A.

Referring to FIG. 5D, the gate electrode GE may be provided on a top surface TS, a bottom surface BS, and opposite sidewalls SW of each of the first to fourth semiconductor patterns SP1 to SP4. For example, a transistor according to some embodiments may be a three-dimensional field effect transistor (e.g., MBCFET or GAAFET) in which the gate electrode GE three-dimensionally surrounds the first and second channel patterns CH1 and CH2.

Referring back to FIGS. 4 and 5A to 5D, on the first active region AR1, an inner spacer ISP may be interposed between the first inner electrode PO1 and the first source/drain pattern SD1. The inner spacer ISP may be omitted between the first source/drain pattern SD1 and the second to fourth inner electrodes PO2 to PO4. The inner spacer ISP may prevent leakage current from the first inner electrode PO1.

On the second active region AR2, the inner spacer ISP may be interposed between the first inner electrode PO1 and the second source/drain pattern SD2. The inner spacer ISP may be omitted between the second source/drain pattern SD2 and the second to fourth inner electrodes PO2 to PO4.

A pair of gate spacers GS may be disposed on opposite sidewalls of the outer electrode OGE of the gate electrode GE. The gate spacers GS may extend in the first direction D1 along the gate electrode GE. The gate spacers GS may have their top surfaces higher than that of the gate electrode GE. The top surfaces of the gate spacers GS may be coplanar with that of a first interlayer dielectric layer 110 which will be discussed below. In some embodiments, the gate spacers GS may include at least one selected from SiCN, SiCON, and/or SiN. In other embodiments, the gate spacers GS may include a multi-layer formed of at least two selected from SiCN, SiCON, and SiN.

In some embodiments of the present inventive concepts, referring to FIG. 6, the gate spacer GS may include a first spacer GS1 on a sidewall of the gate electrode GE and a second spacer GS2 on the first spacer GS1. Each of the first and second spacers GS1 and GS2 may include a silicon-containing dielectric material. For example, the first spacer GS1 may include a silicon-containing low-k dielectric material, for example, SiCON. The second spacer GS2 may include a silicon-containing dielectric material with high resistance to etching, such as SiN. The second spacer GS2 may serve as an etch stop layer when active contacts AC are formed as discussed below. The second spacer GS2 may be used to form the active contacts AC in a self-alignment manner.

Referring to FIGS. 4 and 5A to 5D, a gate capping pattern GP may be provided on the gate electrode GE. The gate capping pattern GP may extend in the first direction D1 along the gate electrode GE. The gate capping pattern GP may include a material having an etch selectivity with respect to first and second interlayer dielectric layers 110 and 120 which will be discussed below. For example, the gate capping pattern GP may include at least one selected from SiON, SiCN, SiCON, and/or SiN.

A gate dielectric layer GI may be interposed between the gate electrode GE and the first channel pattern CH1 and between the gate electrode GE and the second channel pattern CH2. The gate dielectric layer GI may cover or be on the top surface TS, the bottom surface BS, and the opposite sidewalls SW of each of the first to fourth semiconductor patterns SP1 to SP4 (see FIG. 5D). The gate dielectric layer GI may cover or be on a top surface of the device isolation layer ST that underlies the gate electrode GE.

In some embodiments of the present inventive concepts, the gate dielectric layer GI may include one or more of a silicon oxide layer, a silicon oxynitride layer, and/or a high-k dielectric layer. For example, the gate dielectric layer GI may have a structure in which a silicon oxide layer and a high-k dielectric layer are stacked. The high-k dielectric layer may include a high-k dielectric material whose dielectric constant is greater than that of a silicon oxide layer. For example, the high-k dielectric material may include at least one selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate.

Alternatively, a semiconductor device according to some embodiments of the present inventive concepts may include a negative capacitance field effect transistor that uses a negative capacitor. For example, the gate dielectric layer GI may include a ferroelectric material layer that exhibits ferroelectric properties and a paraelectric material layer that exhibits paraelectric properties.

The ferroelectric material layer may have a negative capacitance, and the paraelectric material layer may have a positive capacitance. For example, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing of less than about 60 mV/decade at room temperature.

The ferroelectric material layer may have ferroelectric properties. The ferroelectric material layer may include, for example, one or more of hafnium oxide, hafnium zirconium oxide, barium strontium titanium oxide, and/or lead zirconium titanium oxide. For example, the hafnium zirconium oxide may be a material in which hafnium oxide is doped with zirconium (Zr). For another example, the hafnium zirconium oxide may be a compound of hafnium (Hf), zirconium (Zr), and oxygen (O).

The ferroelectric material layer may further include impurities doped therein. For example, the impurities may include at least one selected from aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The type of impurities included in the ferroelectric material layer may be changed depending on what ferroelectric material is included in the ferroelectric material layer.

When the ferroelectric material layer includes hafnium oxide, the ferroelectric material layer may include at least one of impurities such as gadolinium (Gd), silicon (Si), zirconium (Zr), aluminum (Al), and/or yttrium (Y).

When the impurities are aluminum (Al), the ferroelectric material layer may include about 3 to 8 atomic percent aluminum. In this description, the ratio of impurities may be a ratio of aluminum to the sum of hafnium and aluminum.

When the impurities are silicon (Si), the ferroelectric material layer may include about 2 to about 10 atomic percent silicon. When the impurities are yttrium (Y), the ferroelectric material layer may include about 2 to about 10 atomic percent yttrium. When the impurities are gadolinium (Gd), the ferroelectric material layer may include about 1 to about 7 atomic percent gadolinium. When the impurities are zirconium (Zr), the ferroelectric material layer may include about 50 to about 80 atomic percent zirconium.

The paraelectric material layer may have paraelectric properties. The paraelectric material layer may include, for example, at least one selected from silicon oxide and/or high-k metal oxide. The metal oxide included in the paraelectric material layer may include, for example, at least one selected from hafnium oxide, zirconium oxide, and/or aluminum oxide, but embodiments of the present inventive concepts are not limited thereto.

The ferroelectric and paraelectric material layers may include the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a crystal structure different from that of the hafnium oxide included in the paraelectric material layer.

The ferroelectric material layer may have a thickness having ferroelectric properties. The thickness of the ferroelectric material layer may range, for example, from about 0.5 nm to about 10 nm, but embodiments of the present inventive concepts are not limited thereto. Because ferroelectric materials have their own critical thickness that exhibits ferroelectric properties, the thickness of the ferroelectric material layer may depend on ferroelectric material.

For example, the gate dielectric layer GI may include a single ferroelectric material layer. For another example, the gate dielectric layer GI may include a plurality of ferroelectric material layers that are spaced apart from each other. The gate dielectric layer GI may have a stack structure in which a plurality of ferroelectric material layers are alternately stacked with a plurality of paraelectric material layers.

Referring to FIGS. 4 and 5A to 5D, the gate electrode GE may include a first metal pattern and a second metal pattern on the first metal pattern. The first metal pattern may be provided on the gate dielectric layer GI to adjoin the first to fourth semiconductor patterns SP1 to SP4. The first metal pattern may include a work-function metal that controls a threshold voltage of a transistor. A thickness and composition of the first metal pattern may be adjusted to achieve a desired threshold voltage of a transistor. For example, the first to fourth inner electrodes PO1 to PO4 of the gate electrode GE may be formed of the first metal pattern or a work-function metal.

The first metal pattern may include a metal nitride layer. For example, the first metal pattern may include nitrogen (N) and at least one metal selected from titanium (Ti), tantalum (Ta), aluminum (Al), tungsten (W), and/or molybdenum (Mo). In addition, the first metal pattern may further include carbon (C). The first metal pattern may include a plurality of stacked work-function metal layers.

The second metal pattern may include metal whose resistance is less than that of the first metal pattern. For example, the second metal pattern may include at least one metal selected from tungsten (W), aluminum (Al), titanium (Ti), and/or tantalum (Ta). For example, the outer electrode OGE of the gate electrode GE may include the first metal pattern and may further include a second metal pattern on the first metal pattern.

A first interlayer dielectric layer 110 may be provided on the substrate 100. The first interlayer dielectric layer 110 may cover or be on the gate spacers GS and the first and second source/drain patterns SD1 and SD2. The first interlayer dielectric layer 110 may have a top surface substantially coplanar with that of the gate capping pattern GP and that of the gate spacer GS. The first interlayer dielectric layer 110 may be provided with a second interlayer dielectric layer 120 thereon that covers or is on the gate capping pattern GP. A third interlayer dielectric layer 130 may be provided on the second interlayer dielectric layer 120. A fourth interlayer dielectric layer 140 may be provided on the third interlayer dielectric layer 130. For example, the first to fourth interlayer dielectric layers 110 to 140 may include a silicon oxide layer.

The single height cell SHC may have a first boundary BD1 and a second boundary BD2 that are opposite to each other in the second direction D2. The first and second boundaries BD1 and BD2 may extend in the first direction D1. The single height cell SHC may have a third boundary BD3 and a fourth boundary BD4 that are opposite to each other in the first direction D1. The third and fourth boundaries BD3 and BD4 may extend in the second direction D2.

The single height cell SHC may be provided on its opposite sides with a pair of separation structures DB that are opposite to each other in the second direction D2. For example, the pair of separation structures DB may be provided on first and second boundaries BD1 and BD2 of the single height cell SHC. The separation structure DB may extend in the first direction D1 parallel to the gate electrodes GE. A pitch (e.g., distance) between the separation structure DB and its adjacent gate electrode GE may be the same as the first pitch.

The separation structure DB may penetrate or extend into the first and second interlayer dielectric layers 110 and 120 to extend into the first and second active patterns AP1 and AP2. The separation structure DB may penetrate or extend into the upper portion of each of the first and second active patterns AP1 and AP2. The separation structure DB may electrically separate an active region of the single height cell SHC from an active region of another adjacent cell.

Active contacts AC may be provided to penetrate or extend into the first and second interlayer dielectric layers 110 and 120 to come into electrical connection with the first and second source/drain patterns SD1 and SD2. A pair of active contacts AC may be provided on opposite sides of the gate electrode GE. When viewed in plan, the active contact AC may have a bar shape that extends in the first direction D1.

The active contact AC may be a self-aligned contact. For example, the gate capping pattern GP and the gate spacer GS may be used to form the active contact AC in a self-alignment manner. The active contact AC may cover or be on, for example, at least a portion of a sidewall of the gate spacer GS. Although not shown, the active contact AC may cover or be on a portion of the top surface of the gate capping pattern GP.

A metal-semiconductor compound layer SC, such as a silicide layer, may be interposed between the active contact AC and the first source/drain pattern SD1 and between the active contact AC and the second source/drain pattern SD2. The active contact AC may be electrically connected through the metal-semiconductor compound layer SC to one of the first and second source/drain patterns SD1 and SD2. For example, the metal-semiconductor compound layer SC may include at least one selected from titanium silicide, tantalum silicide, tungsten silicide, nickel silicide, and/or cobalt silicide.

Gate contacts GC may be provided to penetrate or extend into the second interlayer dielectric layer 120 and the gate capping pattern GP to come into electrical connection with the gate electrodes GE. When viewed in plan, the gate contacts GC may be correspondingly or respectively disposed to overlap the first active region AR1 and the second active region AR2. For example, the gate contact GC may be provided on the second active pattern AP2 (see FIG. 5B).

In some embodiments of the present inventive concepts, referring to FIG. 5B, the active contact AC may have an upper portion adjacent to the gate contact GC, and an upper dielectric pattern UIP may fill the upper portion of the active contact AC. The upper dielectric pattern UIP may have a bottom surface lower than that of the gate contact GC. For example, the upper dielectric pattern UIP may cause the active contact AC adjacent to the gate contact GC to have a top surface lower than the bottom surface of the gate contact GC. Therefore, it may be possible to prevent a short circuit resulting from contact between the gate contact GC and its adjacent active contact AC.

Each of the active contact AC and the gate contact GC may include a conductive pattern FM and a barrier pattern BM that surrounds or is on the conductive pattern FM. For example, the conductive pattern FM may include at least one metal selected from aluminum, copper, tungsten, molybdenum, and/or cobalt. The barrier pattern BM may cover or be on sidewalls and a bottom surface of the conductive pattern FM. The barrier pattern BM may include a metal layer and a metal nitride layer. The metal layer may include at least one selected from titanium, tantalum, tungsten, nickel, cobalt, and/or platinum. The metal nitride layer may include at least one selected from a titanium nitride (TiN) layer, a tantalum nitride (TaN) layer, a tungsten nitride (WN) layer, a nickel nitride (NiN) layer, a cobalt nitride (CoN) layer, and/or a platinum nitride (PtN) layer.

A first metal layer M1 may be provided in the third interlayer dielectric layer 130. For example, the first metal layer M1 may include a first power line M1_R1, a second power line M1_R2, and first wiring lines M1_I. The lines M1_R1, M1_R2, and M1_I of the first metal layer M1 may extend parallel to the second direction D2.

For example, the first and second power lines M1_R1 and M1_R2 may be respectively provided on the third and fourth boundaries BD3 and BD4 of the single height cell SHC. The first power line M1_R1 may extend in the second direction D2 along the third boundary BD3. The second power line M1_R2 may extend in the second direction D2 along the fourth boundary BD4.

The first wiring lines M1_I of the first metal layer M1 may be disposed between the first and second power lines M1_R1 and M1_R2. The first wiring lines M1_I of the first metal layer M1 may be arranged at a second pitch along the first direction D1. The second pitch may be less than the first pitch. Each of the first wiring lines M1_I may have a line-width less than that of each of the first and second power lines M1_R1 and M1_R2.

The first metal layer M1 may further include first vias VI1. The first vias VI1 may be correspondingly or respectively provided below the lines M1_R1, M1_R2, and M1_I of the first metal layer M1. The first via VI1 may electrically connect the active contact AC to one of the lines M1_R1, M1_R2, and M1_I of the first metal layer M1. The first via VI1 may electrically connect the gate contact GC to one of the lines M1_R1, M1_R2, and M1_I of the first metal layer M1.

A certain line and its underlying first via VI1 of the first metal layer M1 may be formed by individual processes. For example, the certain line and its underlying first via VI1 of the first metal layer M1 may each be formed by a single damascene process. A sub-20 nm process may be employed to fabricate a semiconductor device according to some embodiments of the present inventive concepts.

A second metal layer M2 may be provided in the fourth interlayer dielectric layer 140. The second metal layer M2 may include a plurality of second wiring lines M2_I. The second wiring lines M2_I of the second metal layer M2 may each have a linear or bar shape that extends in the first direction D1. For example, the second wiring lines M2_I may extend parallel to the first direction D1.

The second metal layer M2 may further include second vias VI2 that are correspondingly or respectively provided below the second wiring lines M2_I. A certain line of the first metal layer M1 may be electrically through the second via VI2 to a corresponding or respective line of the second metal layer M2. For example, a wiring line and its underlying second via VI2 of the second metal layer M2 may be simultaneously formed by a dual damascene process.

The first and second metal layers M1 and M2 may have their wiring lines that include the same or different conductive materials. For example, the wiring lines of the first and second metal layers M1 and M2 may include at least one metallic material selected from aluminum, copper, tungsten, molybdenum, ruthenium, and/or cobalt. Although not shown, other metal layers (e.g., M3, M4, M5, etc.) may be additionally stacked on the fourth interlayer dielectric layer 140. Each of the stacked metal layers may include wiring lines for routing between cells.

The gate electrode GE and the first channel pattern CH1 on the first active pattern AP1 will be discussed in detail with reference to FIG. 6. The first to fourth semiconductor patterns SP1 to SP4 of the first channel pattern CH1 may be vertically spaced apart from each other at a regular interval or distance. The first to fourth inner electrodes PO1 to PO4 may be respectively adjacent below the first to fourth semiconductor patterns SP1 to SP4. The first source/drain pattern SD1 may include first to fourth protrusions PRP1 to PRP4 that respectively protrude toward the first to fourth inner electrodes PO1 to PO4.

The gate dielectric layer GI may surround or be on each of the first to fourth inner electrodes PO1 to PO4. The gate dielectric layer GI that surrounds each of the second to fourth inner electrodes PO2 to PO4 may directly cover a surface of the first source/drain pattern SD1. For example, the gate dielectric layer GI that surrounds the second inner electrode PO2 may cover a surface of the second protrusion PRP2. The gate dielectric layer GI that surrounds the third inner electrode PO3 may cover a surface of the third protrusion PRP3. The gate dielectric layer GI that surrounds the fourth inner electrode PO4 may cover a surface of the fourth protrusion PRP4.

The inner spacer ISP may be interposed between the lowermost first inner electrode PO1 and the first protrusion PRP1 of the first source/drain pattern SD1. The gate dielectric layer GI that surrounds the first inner electrode PO1 may cover a first lateral or side surface SUF1 of the inner spacer ISP. A surface of the protrusion PRP1 may be covered with a second lateral or side surface SUF2 of the inner spacer ISP opposite to the first lateral or side surface SUF1 of the inner spacer ISP.

Each of the first to fourth inner electrodes PO1 to PO4 may have a sandglass shape. For example, each of the first to fourth inner electrodes PO1 to PO4 may have a width in the second direction D2 (e.g., a horizontal width) that decreases and then increases in a direction from upper to lower portions thereof. For example, opposite sidewalls of each of the first to fourth inner electrodes PO1 to PO4 may have a rounded or curved shape that is concavely recessed inward. Each of the first to fourth inner electrodes PO1 to PO4 may have a minimum width between the upper and lower portions thereof.

The minimum widths of the second to fourth inner electrodes PO2 to PO4 may progressively decrease in a direction from a lower tier to an upper tier. For example, a horizontal width of the second to fourth inner electrodes PO2 to PO4 may decrease, with respect to one another, with increasing distance from the first electrode PO1. In some embodiments of the present inventive concepts, the lower tier may be a level close to that of a top surface of the substrate 100. The upper tier may be a level far from that of the top surface of the substrate 100.

A minimum width WI3 of the third inner electrode PO3 may be less than a minimum width WI2 of the second inner electrode PO2. A minimum width WI4 of the fourth inner electrode PO4 may be less than the minimum width WI3 of the third inner electrode PO3. A width WI5 of the outer electrode OGE between a pair of gate spacers GS may be less than the minimum width WI4 of the fourth inner electrode PO4.

According to some embodiments, a minimum width WI1 of the first inner electrode PO1 positioned at a lowermost tier may be less than the minimum width WI2 of the second inner electrode PO2. Because the inner spacer ISP is selectively provided only between the first inner electrode PO1 and the first source/drain pattern SD1, the inner spacer ISP may cause the first inner electrode PO1 to have a reduced thickness and thus the minimum width WI1 of the first inner electrode PO1 may be less than the minimum width WI2 of the second inner electrode PO2.

A gradual increase in integration of a semiconductor device may induce a gradual reduction in interval or distance between a pair of first source/drain patterns SD1. For example, when the inner spacer ISP is provided between the fourth inner electrode PO4 and the first source/drain pattern SD1, it may be difficult to obtain a sufficient space in which the fourth inner electrode PO4 will be formed. An increase in occupying ratio of the inner spacer ISP, which is an insulator, in a space between a pair of first source/drain patterns SD1 may induce an increase in parasitic capacitance between the gate electrode GE and the first source/drain pattern SD1. This situation may degrade electrical properties of a semiconductor device.

In contrast, according to some embodiments of the present inventive concepts, the inner spacer ISP may be provided only on opposite sides of the first inner electrode PO1 at a lowermost tier having a relatively wide interval between the first source/drain patterns SD1, and may be omitted around the second, third, and fourth inner electrodes PO2, PO3, and PO4. In this configuration, the parasitic capacitance may be prevented from being increased, and the inner spacer ISP may protect the first inner electrode PO1 in which leakage current is most frequently produced. As a result, embodiments of the present inventive concepts may improve reliability and electrical properties of a semiconductor device.

The description of the first to fourth semiconductor patterns SP1 to SP4, the first to fourth inner electrodes PO1 to PO4, and the inner spacer ISP of FIG. 6 may be identically applied to the second active region AR2 shown in FIG. 5B. An NMOSFET is adopted as an example of the three-dimensional transistor discussed with reference to FIG. 6, but embodiments of the present inventive concepts are not limited thereto. In some embodiments, the description of the three-dimensional transistor of FIG. 6 may be applicable to PMOSFETs.

FIGS. 7A to 12C illustrate cross-sectional views showing a method of fabricating a semiconductor device according to some embodiments of the present inventive concepts. In detail, FIGS. 7A, 8A, 9A, 10A, 11A, and 12A illustrate cross-sectional views taken along line A-A' of FIG. 4. FIGS. 9B, 10B, 11B, and 12B illustrate cross-sectional views taken along line B-B' of FIG. 4. FIGS. 9C and 10C illustrate cross-sectional views taken along line C-C' of FIG. 4. FIGS. 7B, 8B, 11C, and 12C illustrate cross-sectional views taken along line D-D' of FIG. 4.

Figure 7A:
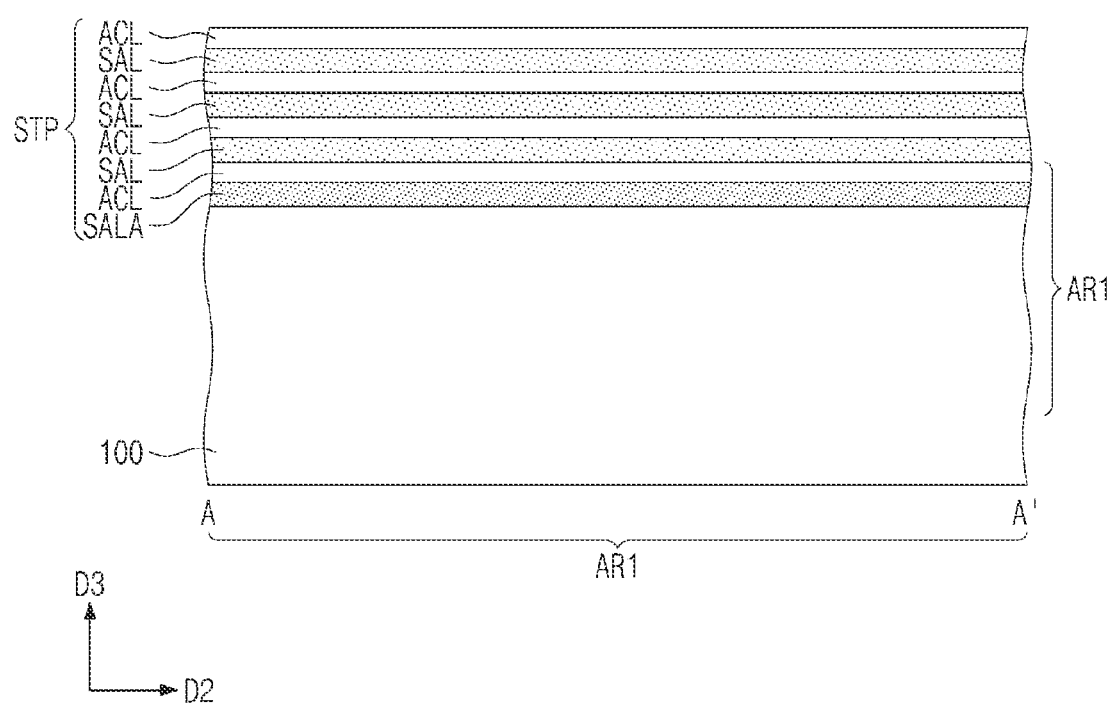
FIGS. 7A, 7B, 8A, 8B, 9A, 9B, 9C, 10A, 10B, 10C, 11A, 11B, 11C, 12A, 12B, and 12C illustrate cross-sectional views showing a method of fabricating a semiconductor device according to some embodiments of the present inventive concepts.
Figure 7B:
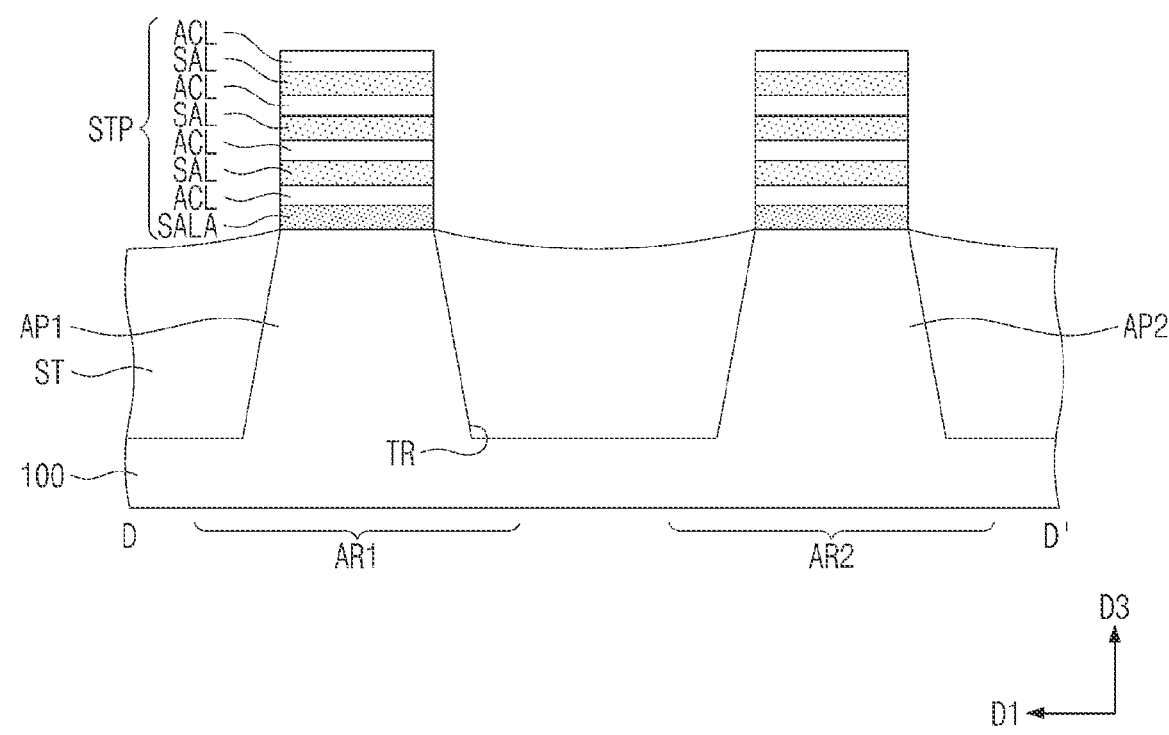

Referring to FIGS. 7A and 7B, a substrate 100 may be provided which includes a first active region AR1 and a second active region AR2. Active layers ACL and sacrificial layers SAL may be alternately stacked on the substrate 100. The active layers ACL may include one of silicon (Si), germanium (Ge), and/or silicon-germanium (SiGe), and the sacrificial layers SAL may include another of silicon (Si), germanium (Ge), and/or silicon-germanium (SiGe).

A lowermost one of the sacrificial layers SAL may be a reinforced sacrificial layer SALA. The reinforced sacrificial layer SALA may be etched at a higher etch rate than other sacrificial layers SAL during an etching process. The reinforced sacrificial layer SALA may have an etch selectivity with respect to other sacrificial layers SAL.

The sacrificial layer SAL may include a material having an etch selectivity with respect to the active layer ACL. For example, the sacrificial layers SAL may include silicon-germanium (SiGe), and the active layers ACL may include silicon (Si). Each of the sacrificial layers SAL may have a germanium concentration of about 10 at % to about 30 at %.

The reinforced sacrificial layer SALA may include a material having an etch selectivity with respect to all of the active layer ACL and the sacrificial layer SAL. For example, the reinforced sacrificial layer SALA may include silicon-germanium (SiGe), and a germanium concentration of the reinforced sacrificial layer SALA may be greater than that of the sacrificial layer SAL. The reinforced sacrificial layer SALA may have a germanium concentration of about 30 at % to about 50 at %.

Mask patterns may be formed on each of the first and second active regions AR1 and AR2 of the substrate 100. The mask pattern may have a linear or bar shape that extends in a second direction D2.

A patterning process may be performed in which the mask patterns are used as an etching mask to form a trench TR that defines a first active pattern AP1 and a second active pattern AP2. The first active pattern AP1 may be formed on the first active region AR1. The second active pattern AP2 may be formed on the second active region AR2.

A stack pattern STP may be formed on each of the first and second active patterns AP1 and AP2. The stack pattern STP may include the active layers ACL and the sacrificial layers SAL that are alternately stacked. The reinforced sacrificial layer SALA may be provided at a lowermost position of the stack pattern STP. During the patterning process, the stack pattern STP may be formed together with the first and second active patterns AP1 and AP2.

A device isolation layer ST may be formed to fill the trench TR. For example, a dielectric layer may be formed on an entire surface of the substrate 100 to cover the stack patterns STP and the first and second active patterns AP1 and AP2. The dielectric layer may be recessed until the stack patterns STP are exposed, and thus the device isolation layer ST may be formed.

The device isolation layer ST may include a dielectric material, such as a silicon oxide layer. The stack patterns STP may be exposed from the device isolation layer ST. For example, the stack patterns STP may vertically protrude upwards from the device isolation layer ST.

Figure 8A:
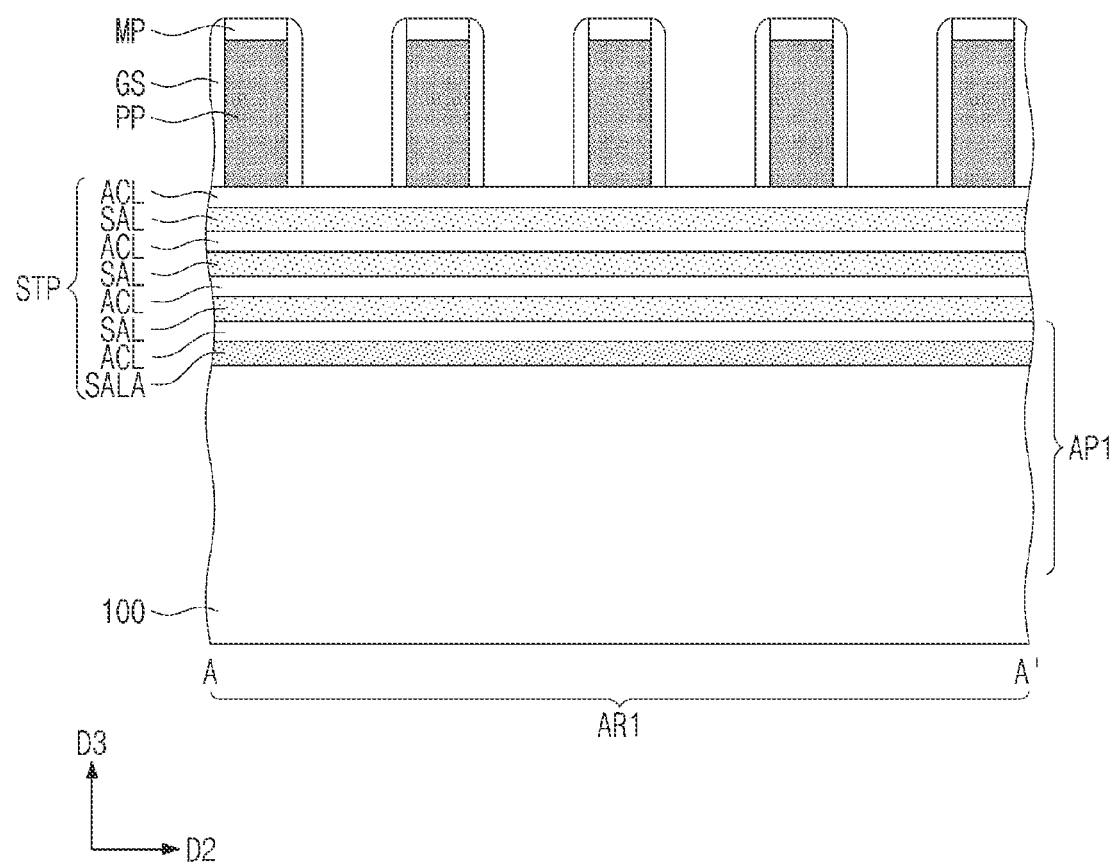
Figure 8B:
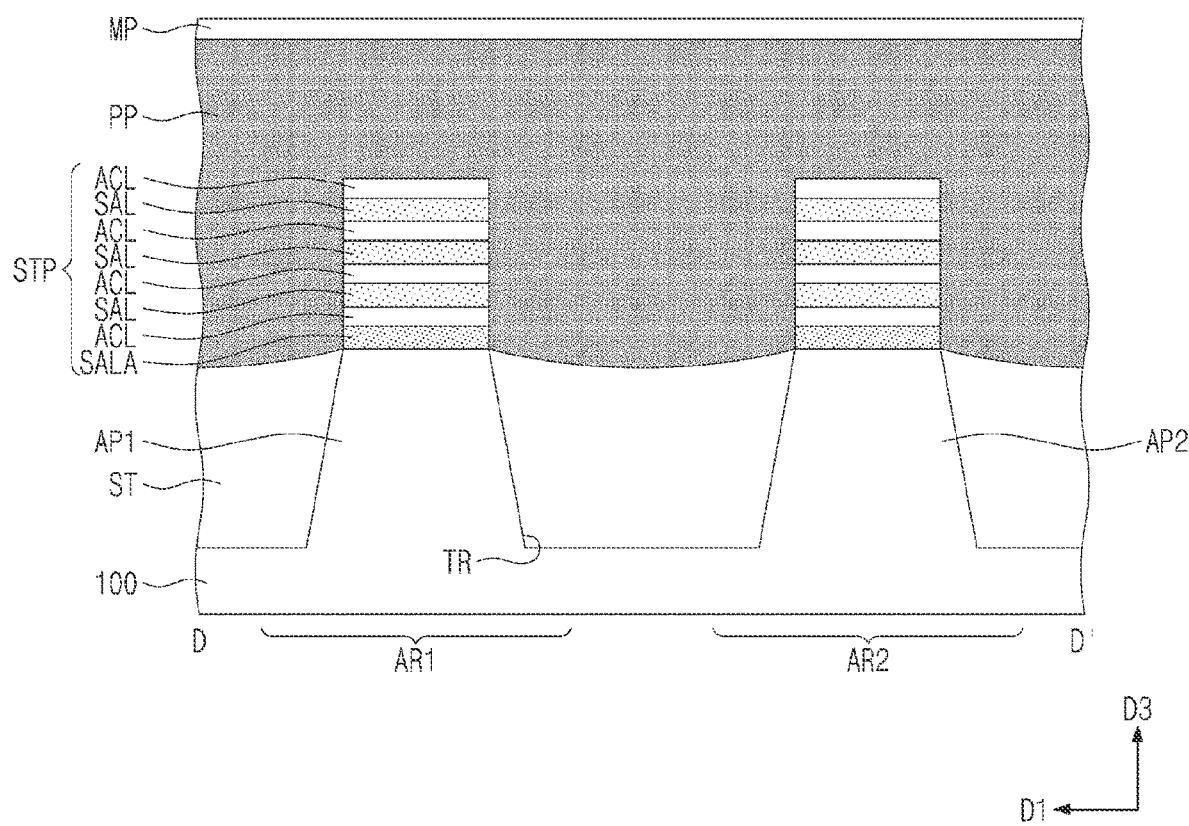

Referring to FIGS. 8A and 8B, sacrificial patterns PP may be formed on the substrate 100, running across the stack patterns STP. Each of the sacrificial patterns PP may be formed to have a linear or bar shape that extends in a first direction D1. The sacrificial patterns PP may be arranged at a first pitch along the second direction D2.

For example, the formation of the sacrificial patterns PP may include forming a sacrificial layer on the entire surface of the substrate 100, forming hardmask patterns MP on the sacrificial layer, and using the hardmask patterns MP as an etching mask to pattern the sacrificial layer. The sacrificial layer may include polysilicon.

A pair of gate spacers GS may be formed on opposite sidewalls of each of the sacrificial patterns PP. The formation of the gate spacers GS may include conformally forming a gate spacer layer on the entire surface of the substrate 100 and anisotropically etching the gate spacer layer. In some embodiments of the present inventive concepts, the gate spacer GS may be a multiple layer including at least two layers.

Figure 9A:
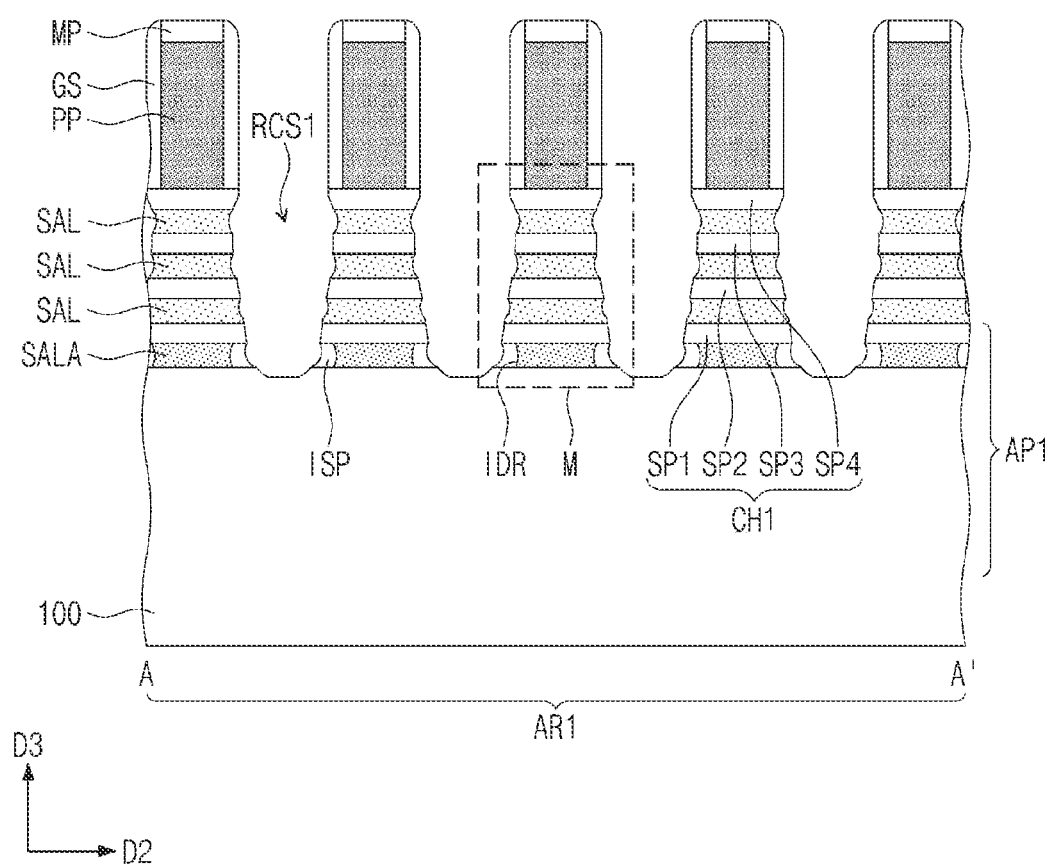
Figure 9B:
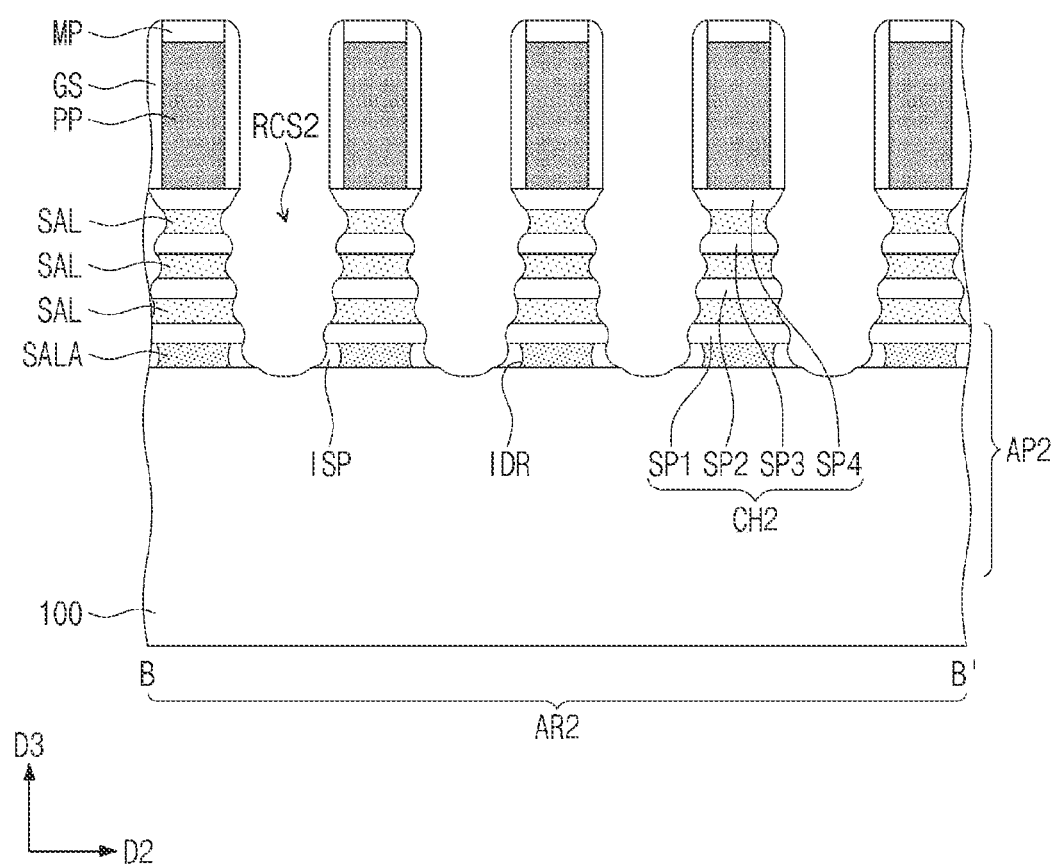
Figure 9C:
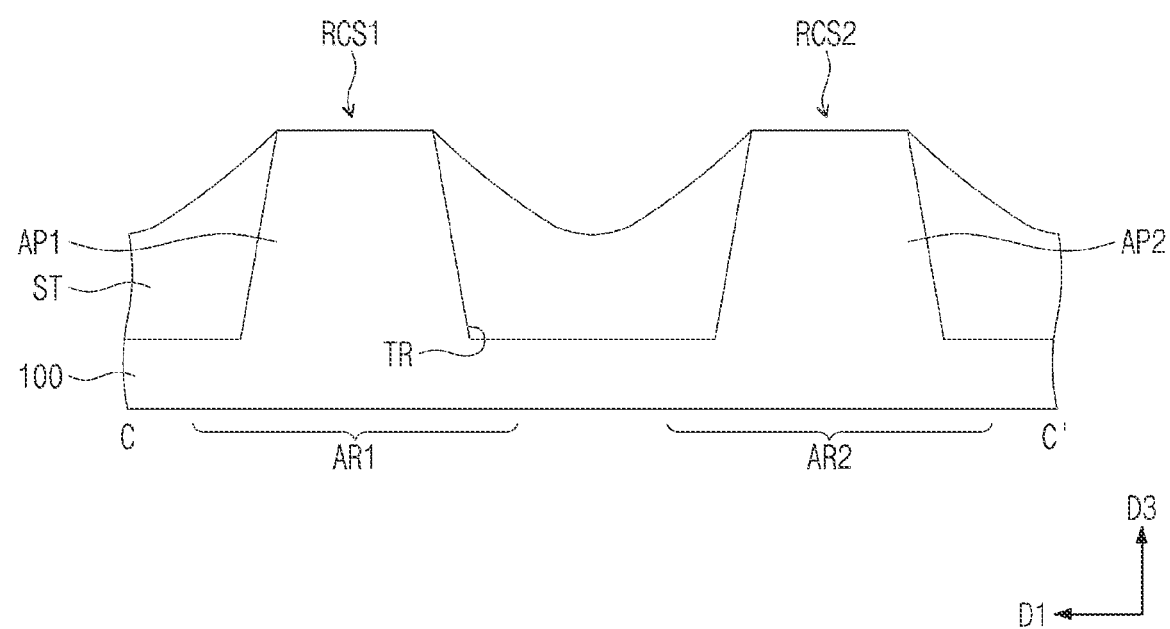

Referring to FIGS. 9A to 9C, first recesses RCS1 may be formed in the stack pattern STP on the first active pattern AP1. Second recesses RCS2 may be formed in the stack pattern STP on the second active pattern AP2. During the formation of the first and second recesses RCS1 and RCS2, the device isolation layer ST may be further recessed on opposite sides of each of the first and second active patterns AP1 and AP2 (see FIG. 9C).

For example, the hardmask patterns MP and the gate spacers GS may be used as an etching mask to etch the stack pattern STP on the first active pattern AP1, and thus the first recesses RCS1 may be formed. The first recess RCS1 may be formed between a pair of sacrificial patterns PP. A width in the second direction D2 of the first recess RCS1 may decrease with decreasing distance from the substrate 100.

The active layers ACL may be formed into first to fourth semiconductor patterns SP1 to SP4 that are sequentially stacked between neighboring first recesses RCS1. A first channel pattern CH1 may be constituted by or may include the first to fourth semiconductor patterns SP1 to SP4 between neighboring first recesses RCS1.

The second recesses RCS2 in the stack pattern STP on the second active pattern AP2 may be formed by a method similar to that used for forming the first recesses RCS1. A second channel pattern CH2 may be constituted by or may include the first to fourth semiconductor patterns SP1 to SP4 between neighboring second recesses RCS2.

The lowermost reinforced sacrificial layer SALA exposed by the first recess RCS1 may be indented to form an indent region IDR. The lowermost reinforced sacrificial layer SALA exposed by the second recess RCS2 may also be indented to form an indent region IDR. An inner spacer ISP may be formed in each of the indent regions IDR. A wet etching process performed on the sacrificial layers SAL may cause the first and second recesses RCS1 and RCS2 to each have an inner sidewall shaped like a wave.

With reference to FIGS. 13 to 16, the following will describe in detail the selective formation of the inner spacer ISP and the indent region IDR on the lowermost reinforced sacrificial layer SALA. FIGS. 13, 14, 15, and 16 illustrate enlarged views showing a method of forming a section M depicted in FIG. 9A.

Figure 13:
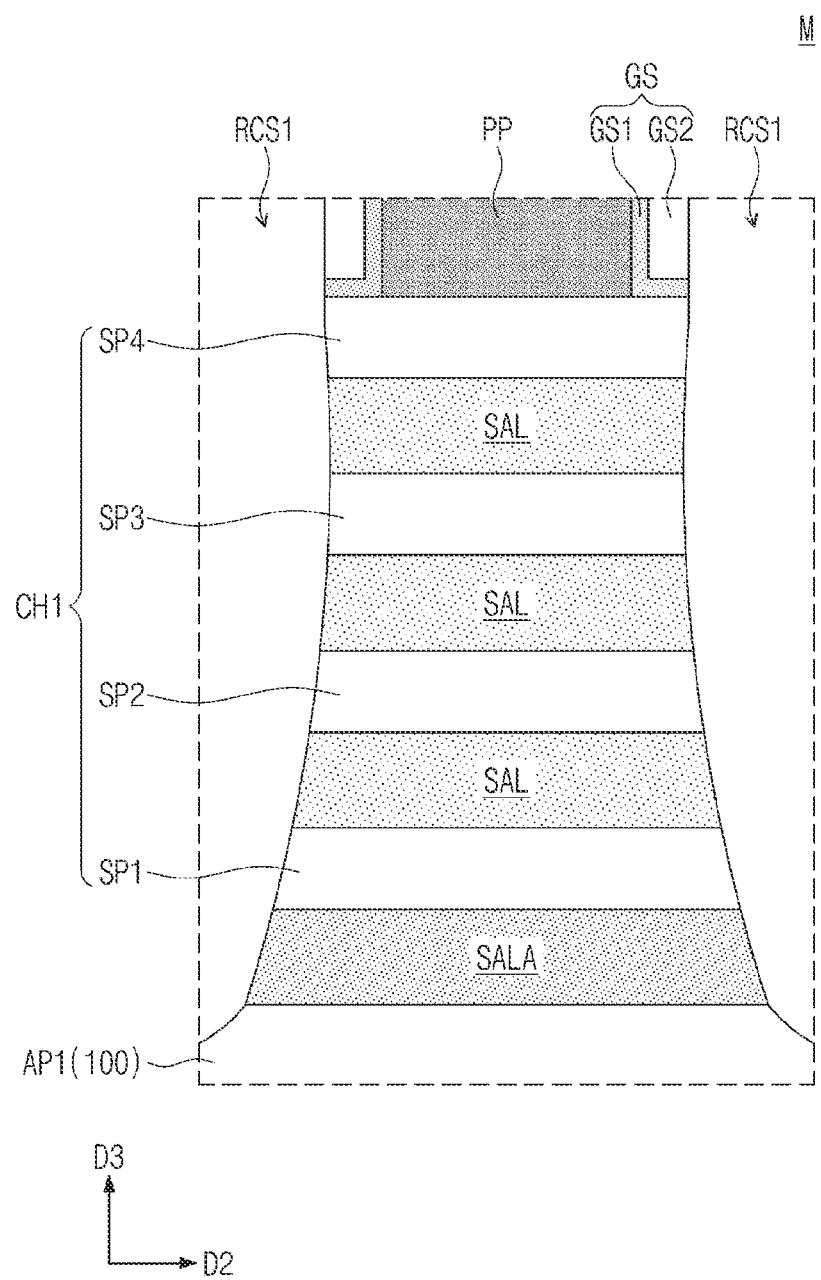
FIGS. 13, 14, 15, and 16 illustrate enlarged views showing a method of forming a section M depicted in FIG. 9A.

Referring to FIG. 13, the first recesses RCS1 may be formed in the stack pattern STP on the first active pattern AP1. The first recess RCS1 may be formed to have a rounded inner sidewall. The first recess RCS1 may expose the sacrificial layers SAL and the reinforced sacrificial layer SALA.

Figure 14:
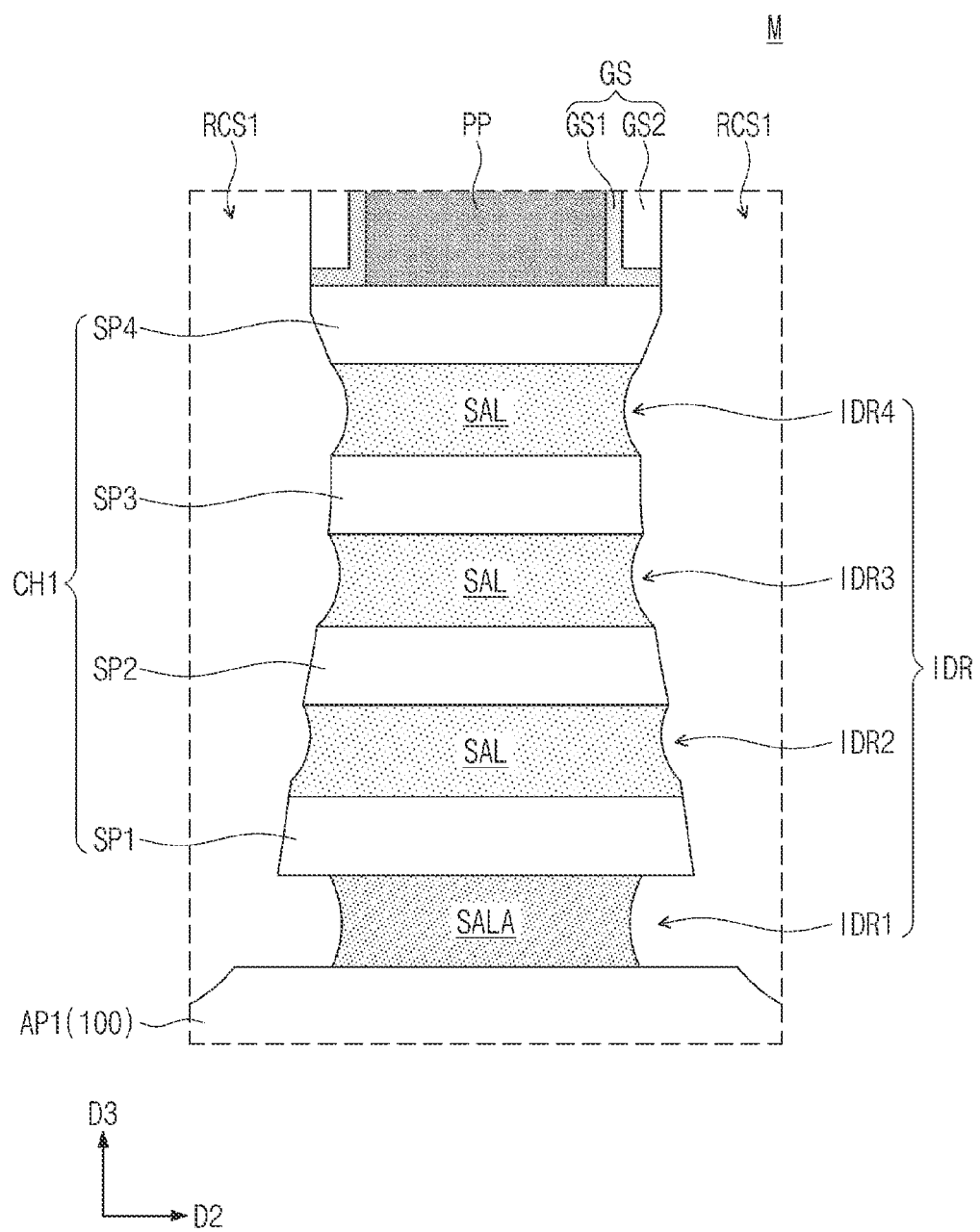

Referring to FIG. 14, a selective etching process may be performed on the exposed sacrificial layers SAL and the exposed reinforced sacrificial layer SALA. The etching process may include a wet etching process having a high etch rate with respect to the reinforced sacrificial layer SALA.

In some embodiments of the present inventive concepts, the wet etching process may have an etch recipe by which a material having a higher germanium concentration is etched at a higher etch rate. Therefore, the wet etching process may rarely etch the first to fourth semiconductor patterns SP1 to SP4 having a minimum germanium concentration. During the wet etching process, the sacrificial layers SAL containing a low germanium concentration may be lightly etched to form second, third, and fourth indent regions IDR2, IDR3, and IDR4. During the wet etching process, the reinforced sacrificial layer SALA containing a high germanium concentration may be heavily etched to form a first indent region IDR1.

The first indent region IDR1 may be a horizontal recess region larger than the second, third, and fourth indent regions IDR2, IDR3, and IDR4. The first to fourth indent regions IDR1 to IDR4 may cause the first recess RCS1 to have a rugged or wavy shape.

In other embodiments of the present inventive concepts, during the wet etching process, the first indent region IDR1 may be formed, and any of the second, third, and fourth indent regions IDR2, IDR3, and IDR4 may not be formed.

Figure 15:
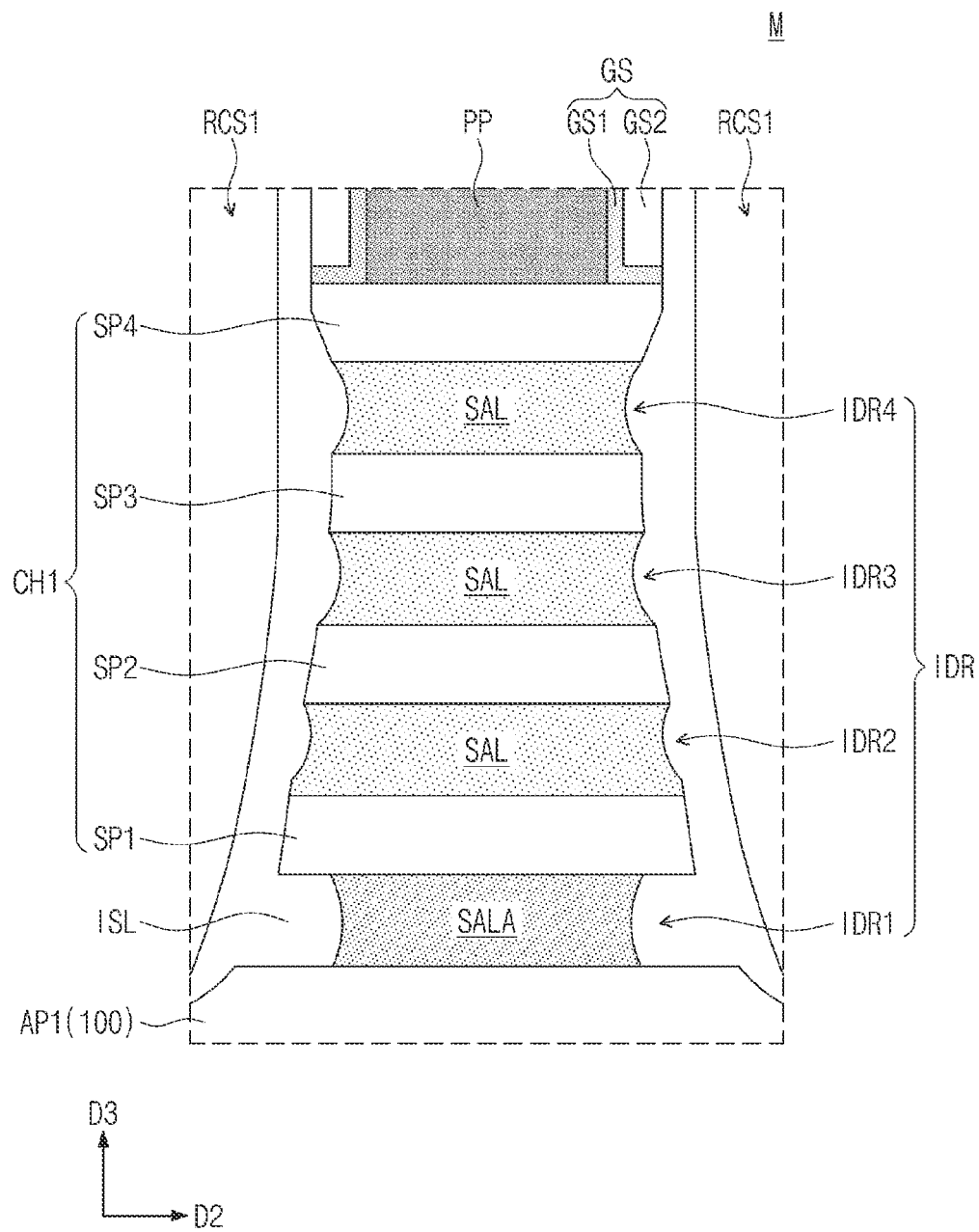

Referring to FIG. 15, an inner dielectric layer ISL may be formed in the first recess RCS1, filling the first to fourth indent regions IDR1 to IDR4. The inner dielectric layer ISL may be conformally formed in the first recess RCS1. The inner dielectric layer ISL may be formed of a silicon-based dielectric material. For example, the inner dielectric layer ISL may include at least one selected from a silicon oxide layer, a silicon nitride layer, and/or a silicon oxynitride layer.

Figure 16:
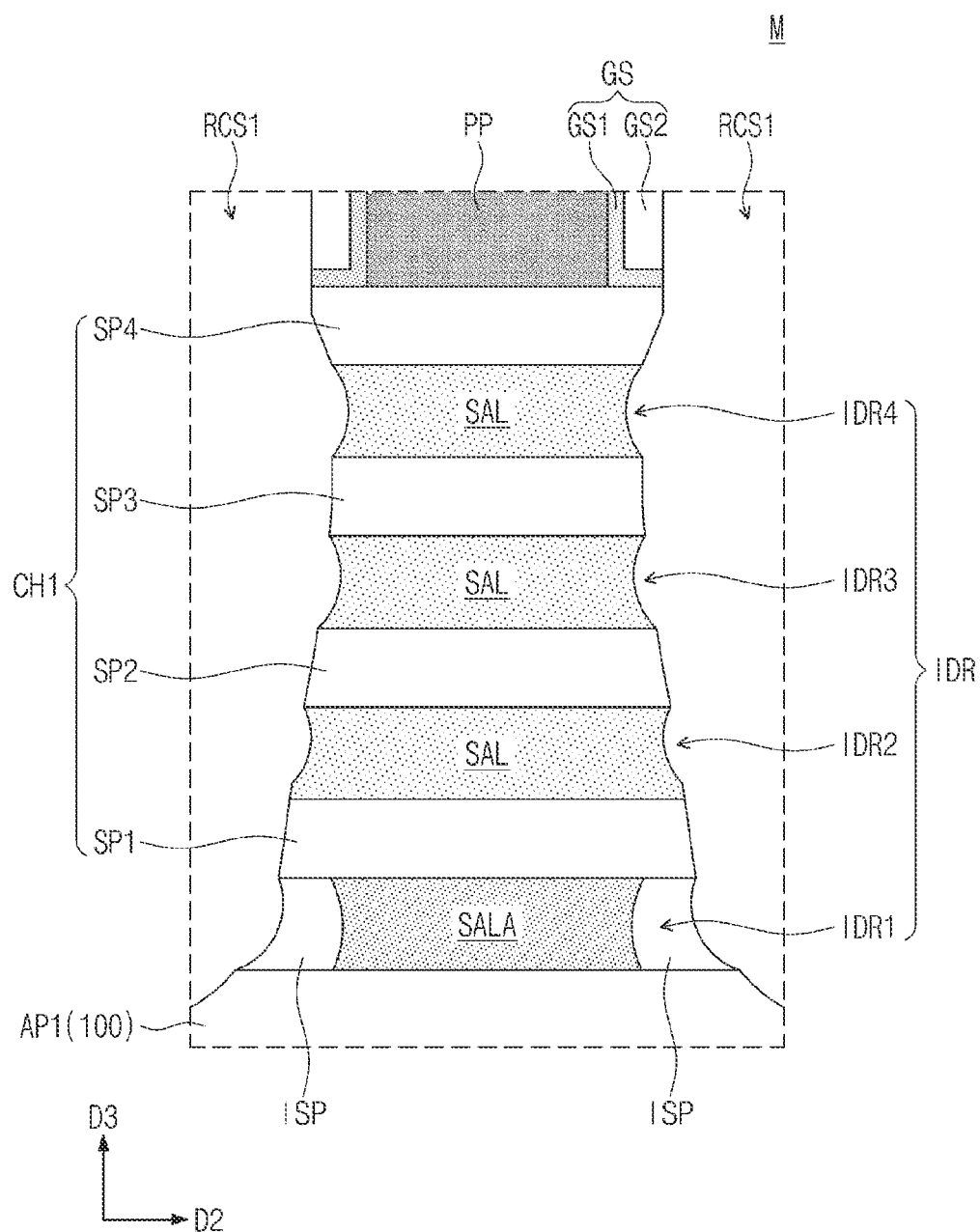

Referring to FIG. 16, the inner dielectric layer ISL may undergo a wet etching process until sidewalls of the first to fourth semiconductor patterns SP1 to SP4 are exposed. Therefore, the inner dielectric layer ISL may be entirely removed in the shallow second, third, and fourth indent regions IDR2, IDR3, and IDR4. For example, sidewalls of the sacrificial layers SAL may also be exposed. In contrast, the inner dielectric layer ISL in the deep first indent region IDR1 may remain to form an inner spacer ISP. The inner spacer ISP may not allow exposure of a sidewall of the reinforced sacrificial layer SALA.

According to some embodiments of the present inventive concepts, the inner spacer ISP may be selectively formed only in the lowermost reinforced sacrificial layer SALA, and thus it may be possible to suppress a most probable cause of leakage current and simultaneously to reduce parasitic capacitance. In addition, the selective formation of the inner spacer ISP may be easily accomplished by using the reinforced sacrificial layer SALA whose germanium concentration is controlled. Consequently, embodiments of the present inventive concepts may increase reliability of semiconductor fabrication methods and may improve electrical properties of finally fabricated devices.

The formation of the second recess RCS2, the indent region IDR, and the inner spacer ISP of FIG. 9B may be substantially the same as or similar to that discussed above with reference to FIGS. 13 to 16.

Figure 10A:
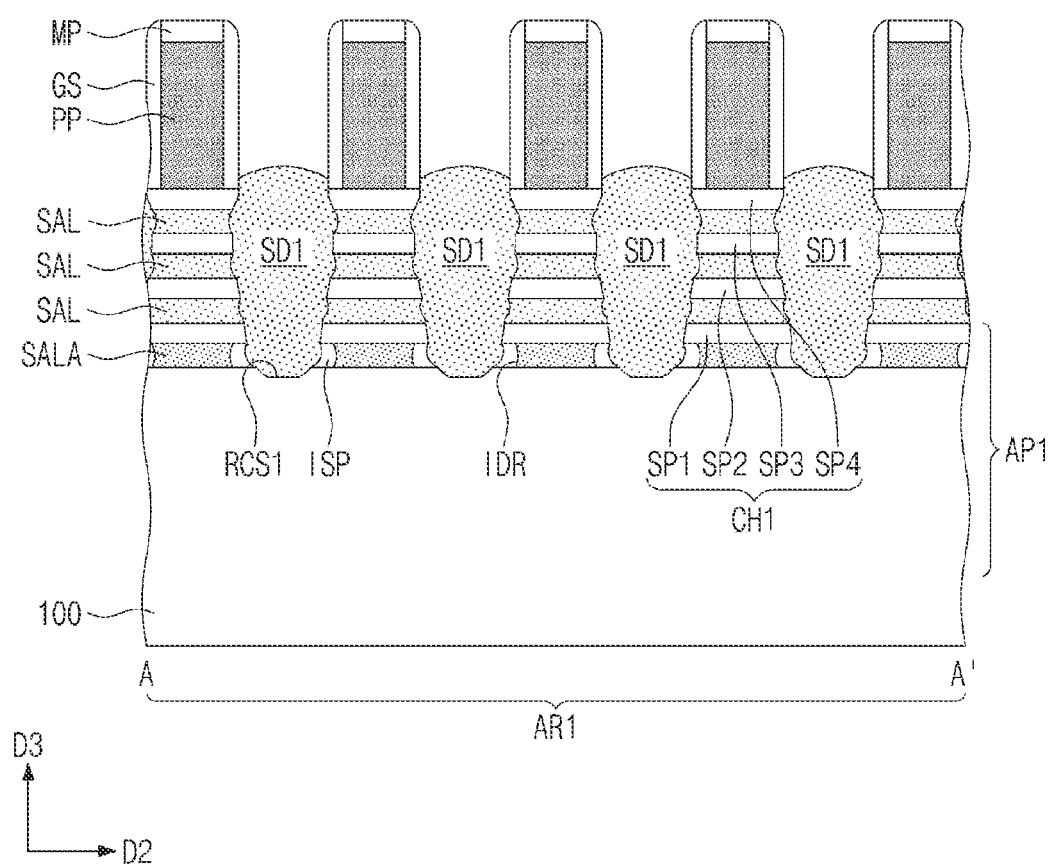
Figure 10B:
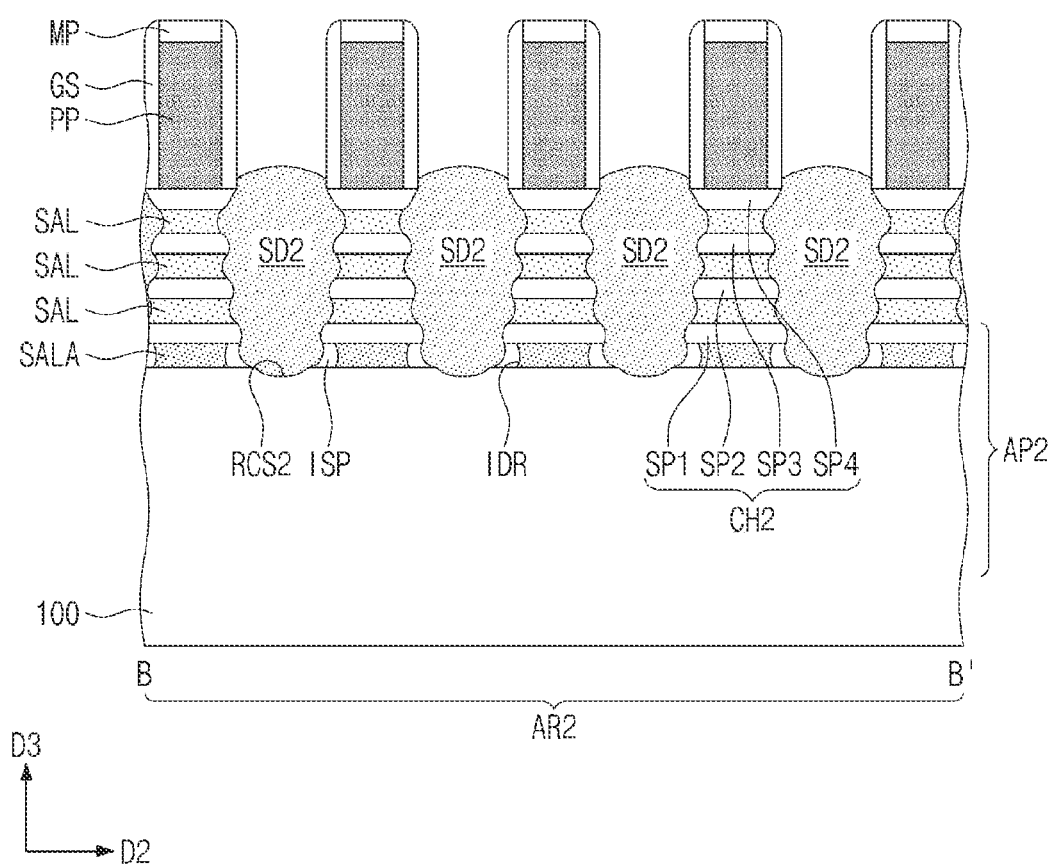
Figure 10C:
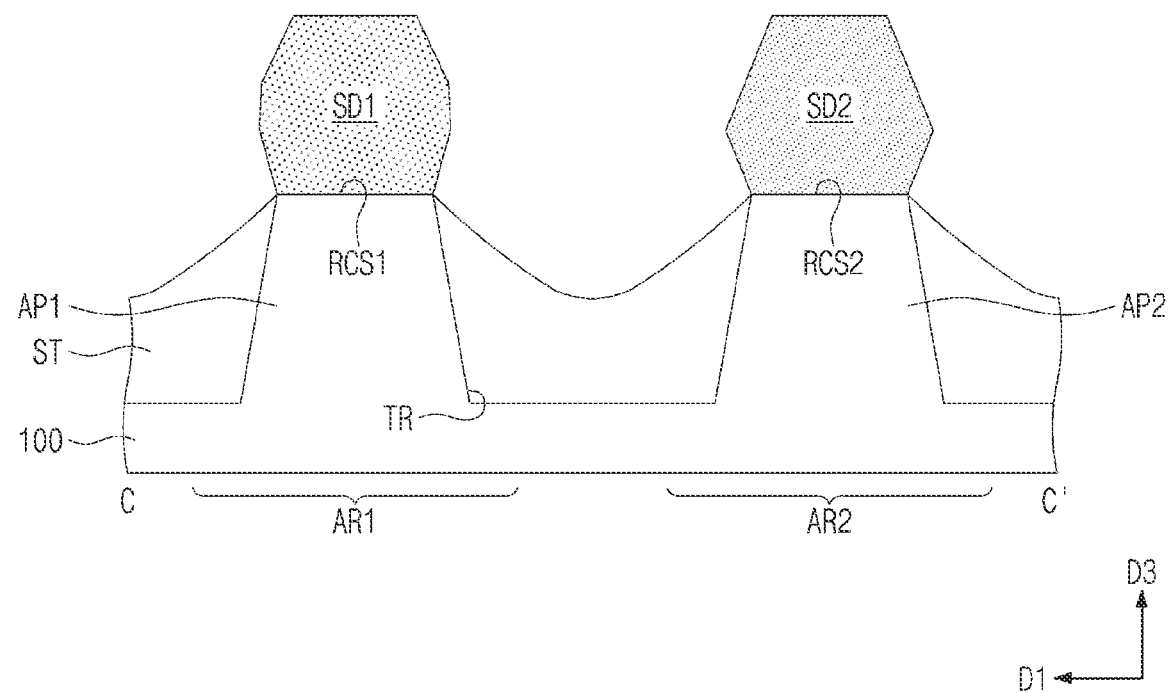

Referring to FIGS. 10A to 10C, first source/drain patterns SD1 may be formed in the first recesses RCS1. For example, a first selective epitaxial growth (SEG) process may be performed such that an inner sidewall of the first recess RCS1 may be used as a seed layer to form an epitaxial layer that fills the first recess RCS1. The epitaxial layer may be grown from a seed, or the first to fourth semiconductor patterns SP1 to SP4, the sacrificial layers SAL, and the first active pattern AP1 (or an upper portion of the substrate 100) that are exposed by the first recess RCS1. For example, the first SEG process may include chemical vapor deposition (CVD) or molecular beam epitaxy (MBE).

In some embodiments of the present inventive concepts, the first source/drain pattern SD1 may include the same semiconductor element (e.g., Si) as that of the substrate 100. While the first source/drain pattern SD1 is formed, impurities (e.g., phosphorus, arsenic, or antimony) may be in-situ implanted to allow the first source/drain pattern SD1 to have an n-type. Alternatively, after the first source/drain pattern SD1 is formed, impurities may be implanted into the first source/drain pattern SD1.

Second source/drain patterns SD2 may be correspondingly or respectively formed in the second recesses RCS2. For example, a second SEG process may be performed such that an inner sidewall of the second recess RCS2 may be used as a seed layer to form the second source/drain pattern SD2. The second source/drain pattern SD2 may be grown from a seed, or the first to fourth semiconductor patterns SP1 to SP4, the sacrificial layers SAL, and the second active pattern AP2 (or an upper portion of the substrate 100) that are exposed by the second recess RCS2.

In some embodiments of the present inventive concepts, the second source/drain patterns SD2 may include a semiconductor element (e.g., SiGe) whose lattice constant is greater than that of a semiconductor element of the substrate 100. While the second source/drain pattern SD2 is formed, impurities (e.g., boron, gallium, or indium) may be in-situ implanted to allow the second source/drain pattern SD2 to have a p-type. Alternatively, after the second source/drain pattern SD2 is formed, impurities may be implanted into the second source/drain pattern SD2.

Figure 11A:
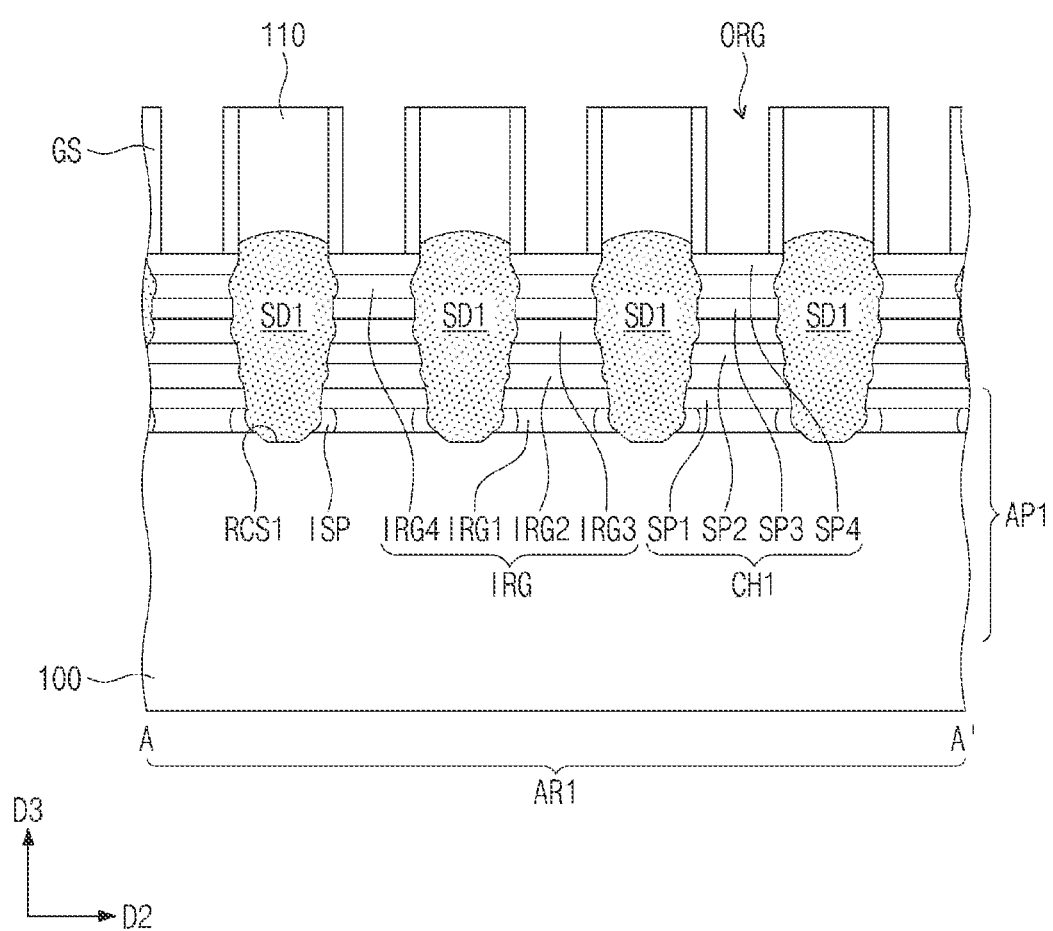
Figure 11B:
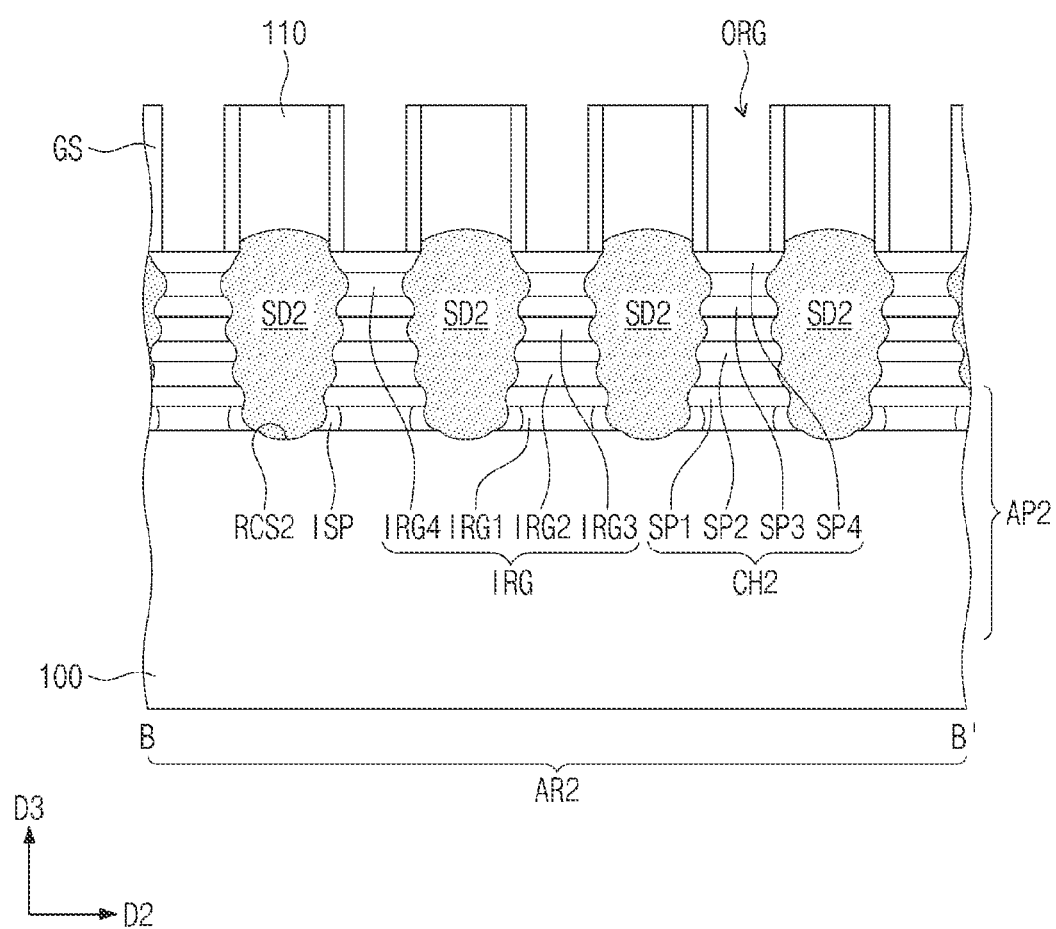
Figure 11C:
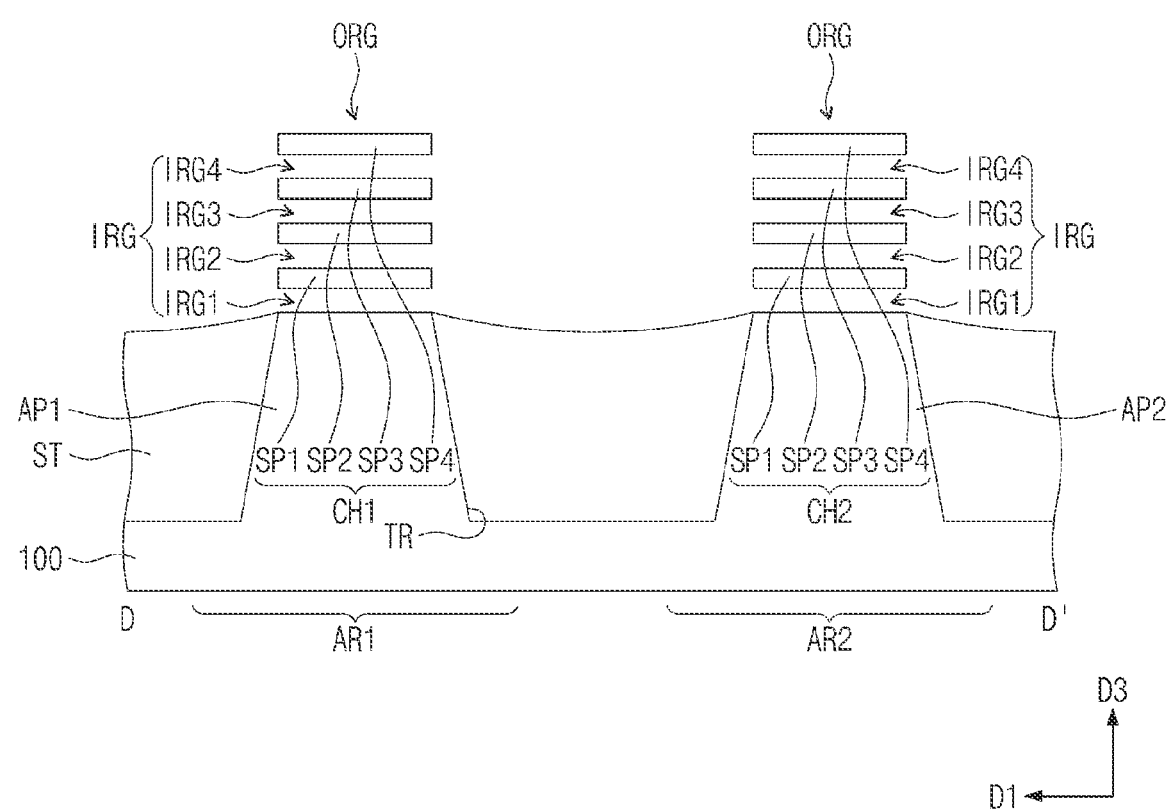

Referring to FIGS. 11A to 11C, a first interlayer dielectric layer 110 may be formed to cover or be on the first and second source/drain patterns SD1 and SD2, the hardmask patterns MP, and the gate spacers GS. For example, the first interlayer dielectric layer 110 may include a silicon oxide layer.

The first interlayer dielectric layer 110 may be planarized until top surfaces of the sacrificial patterns PP are exposed. An etch-back or chemical mechanical polishing (CMP) process may be employed to planarize the first interlayer dielectric layer 110. The hardmask patterns MP may all be removed during the planarization process. As a result, the first interlayer dielectric layer 110 may have a top surface coplanar with those of the sacrificial patterns PP and those of the gate spacers GS.

The exposed sacrificial patterns PP may be selectively removed. The removal of the sacrificial patterns PP may form an outer region ORG that exposes the first and second channel patterns CH1 and CH2 (see FIG. 11C). The removal of the sacrificial patterns PP may include performing a wet etching process that uses an etchant selectively etching polysilicon.

The sacrificial layers SAL and the reinforced sacrificial layer SALA exposed through the outer region ORG may be selectively removed to form inner regions IRG (see FIG. 11C). For example, an etching process that selectively etches the sacrificial layers SAL and SALA may be performed such that only the sacrificial layers SAL and SALA may be removed while leaving the first to fourth semiconductor patterns SP1 to SP4. The etching process may have a high etch rate with respect to silicon-germanium having a relatively high germanium concentration. For example, the etching process may have a high etch rate with respect to silicon-germanium whose germanium concentration is greater than about 10 at %.

The etching process may remove the sacrificial layers SAL and SALA on the first and second active regions AR1 and AR2. The etching process may be a wet etching process. An etching material used for the etching process may promptly etch the sacrificial layer SAL and SALA whose germanium concentrate is relatively high.

Referring back to FIG. 11C, as the sacrificial layers SAL and SALA are selectively removed, only the first to fourth semiconductor patterns SP1 to SP4 may remain on each of the first and second active patterns AP1 and AP2. The removal of the sacrificial layers SAL and SALA may form first to fourth inner regions IRG1 to IRG4.

For example, the first inner region IRG1 may be formed between the active pattern AP1 or AP2 and the first semiconductor pattern SP1, the second inner region IRG2 may be formed between the first semiconductor pattern SP1 and the second semiconductor pattern SP2, the third inner region IRG3 may be formed between the second semiconductor pattern SP2 and the third semiconductor pattern SP3, and the fourth inner region IRG4 may be formed between the third semiconductor pattern SP3 and the fourth semiconductor pattern SP4.

Referring back to FIGS. 11A and 11B, sizes of the second, third, and fourth inner regions IRG2, IRG3, and IGR4 according to some embodiments of the present inventive concepts may progressively decrease in a direction from a lower tier to an upper tier. For example, according to some embodiments of the present inventive concepts a horizontal width of the second inner region IRG2 may be greater than that of the third inner region IRG3 and a horizontal width of the third inner region IRG3 may be greater than that of the fourth inner region IRG4. A size of the first inner region IRG1 at a lowermost tier may be less than that of the second inner region IRG2. For example, a horizontal width of the first inner region IRG1 may be less than that of the second inner region IRG2. This may be because that the inner spacer ISP is present only in the first inner region IRG1.

Figure 12A:
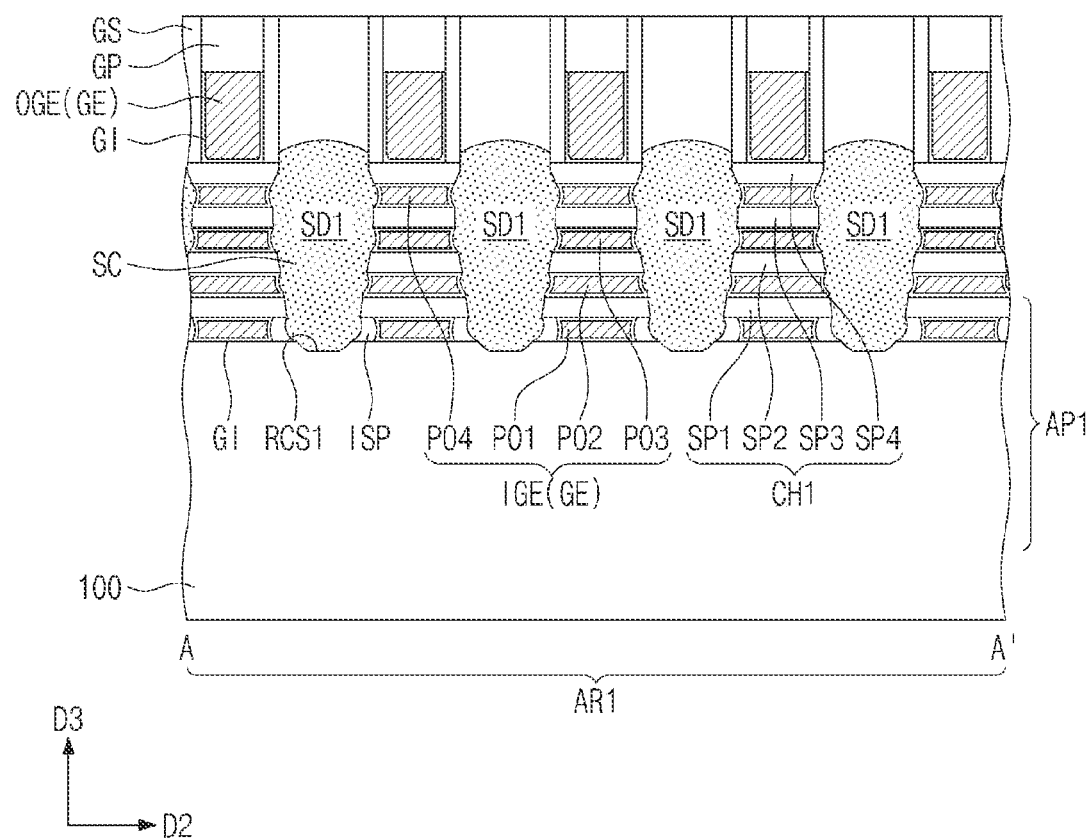
Figure 12B:
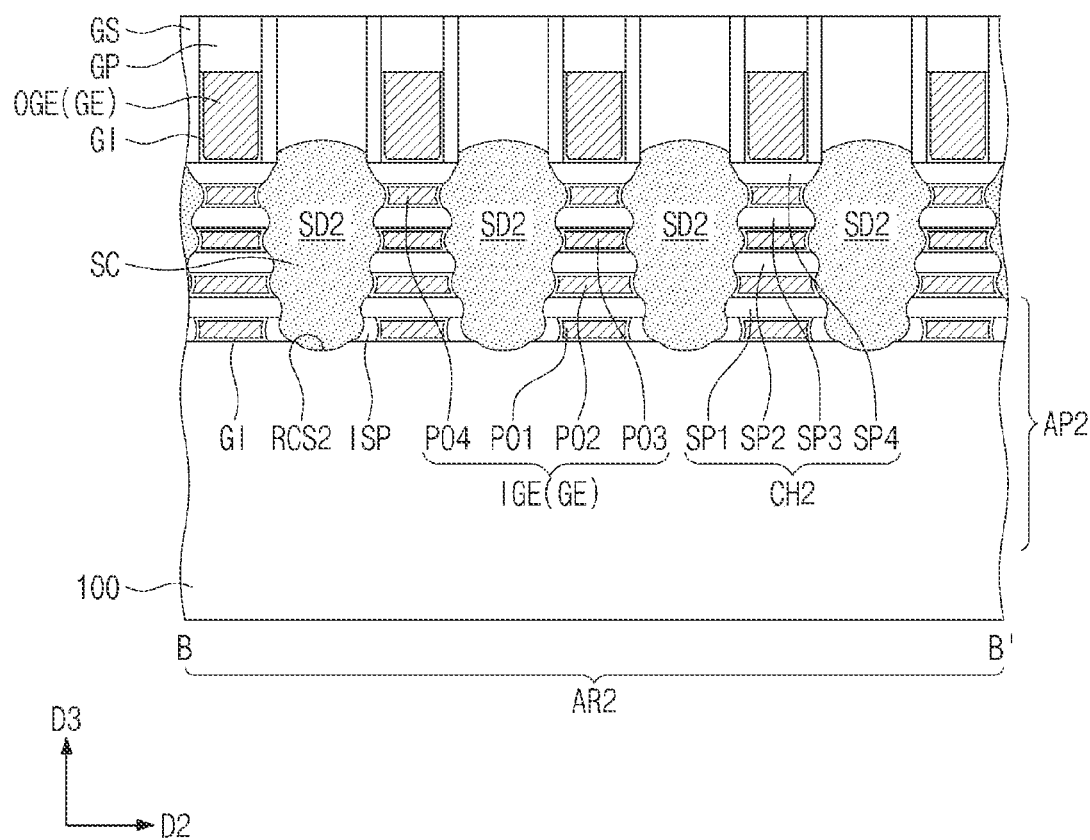
Figure 12C:
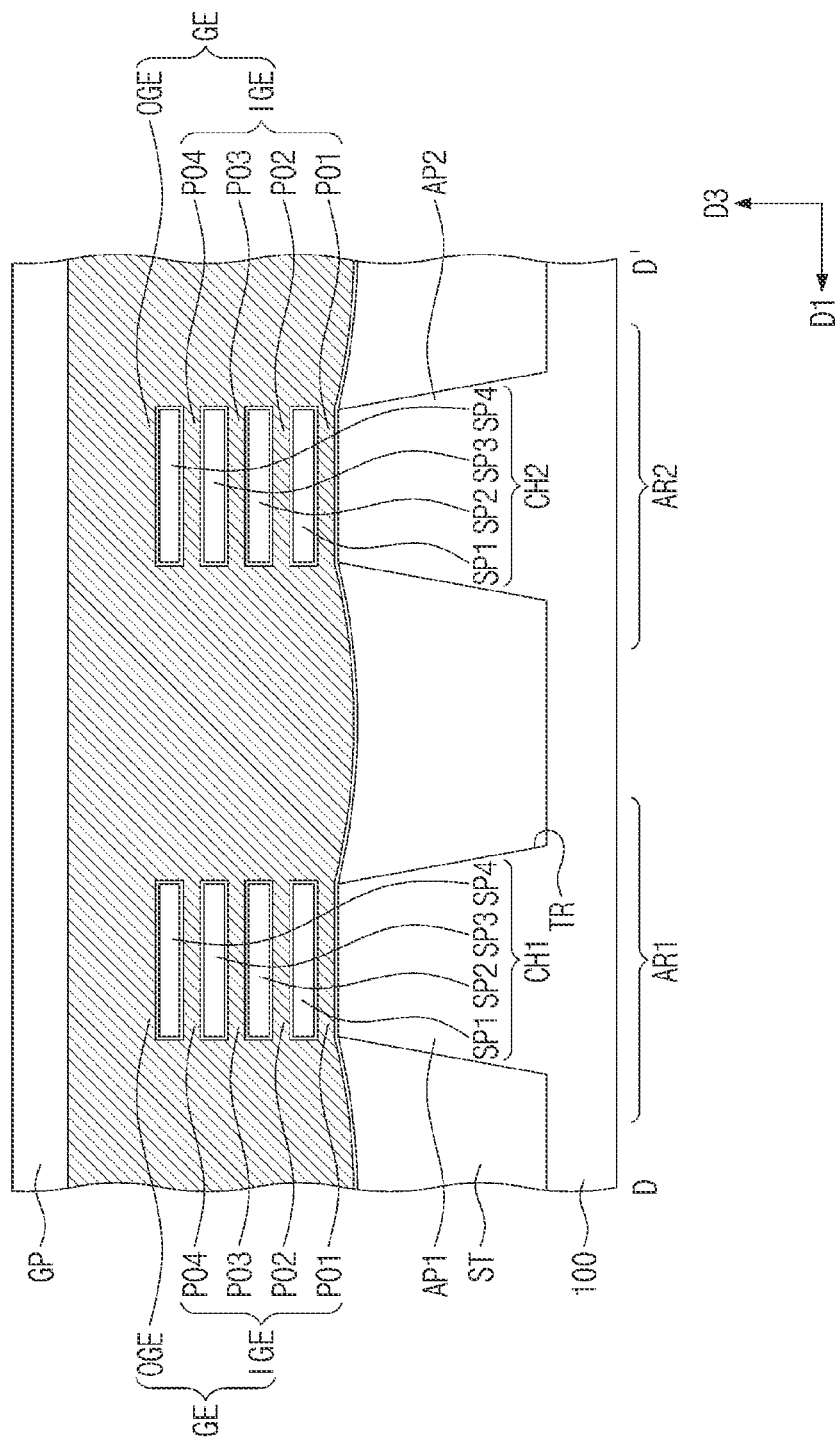

Referring to FIGS. 12A to 12C, a gate dielectric layer GI may be formed on the exposed first to fourth semiconductor patterns SP1 to SP4. The gate dielectric layer GI may be formed to surround each of the first to fourth semiconductor patterns SP1 to SP4. The gate dielectric layer GI may be formed in each of the first to fourth inner regions IRG1 to IRG4. The gate dielectric layer GI may be formed in the outer region ORG. The formation of the gate dielectric layer GI may include sequentially forming a silicon oxide layer and a high-k dielectric layer.

A gate electrode GE may be formed on the gate dielectric layer GI. The gate electrode GE may include first to fourth inner electrodes PO1 to PO4 that are correspondingly or respectively formed in the first to fourth inner regions IRG1 to IRG4 and an outer electrode OGE formed in the outer region ORG.

The second, third, and fourth inner electrodes PO2, PO3, and PO4 may have their widths (or volumes) that progressively decrease in a direction from a lower tier to an upper tier (see FIG. 6). A width (or volume) of the first inner electrode PO1 may be less than a width (or volume) of the second inner electrode PO2.

An upper portion of the outer electrode OGE may be recessed to allow the gate electrode GE to have a top surface lower than that of the gate spacer GS. A gate capping pattern GP may be formed on the recessed gate electrode GE. The gate capping pattern GP may have a top surface coplanar with that of the gate spacer GS.

Referring back to FIGS. 5A to 5D, a second interlayer dielectric layer 120 may be formed on the first interlayer dielectric layer 110. The second interlayer dielectric layer 120 may include a silicon oxide layer. Active contacts AC may be formed to penetrate or extend into the second and first interlayer dielectric layers 120 and 110 to come into electrical connection with the first and second source/drain patterns SD1 and SD2. A gate contact GC may be formed to penetrate or extend into the second interlayer dielectric layer 120 and the gate capping pattern GP to come into electrical connection with the gate electrode GE.

The formation of each of the active contact AC and the gate contact GC may include forming a barrier pattern BM and forming a conductive pattern FM on the barrier pattern BM. The barrier pattern BM may be conformally formed to include a metal layer and a metal nitride layer. The conductive patterns FM may include metal whose resistance is low. Separation structures DB may be correspondingly or respectively formed on first and second boundaries BD1 and BD2 of the single height cell SHC. The separation structure DB may extend from the second interlayer dielectric layer 120 through the gate electrode GE into the active pattern AP1 or AP2. The separation structure DB may include a dielectric material, such as a silicon oxide layer or a silicon nitride layer.

A third interlayer dielectric layer 130 may be formed on the active contacts AC and the gate contacts GC. A first metal layer M1 may be formed in the third interlayer dielectric layer 130. A fourth interlayer dielectric layer 140 may be formed on the third interlayer dielectric layer 130. A second metal layer M2 may be formed in the fourth interlayer dielectric layer 140.

Figure 17:
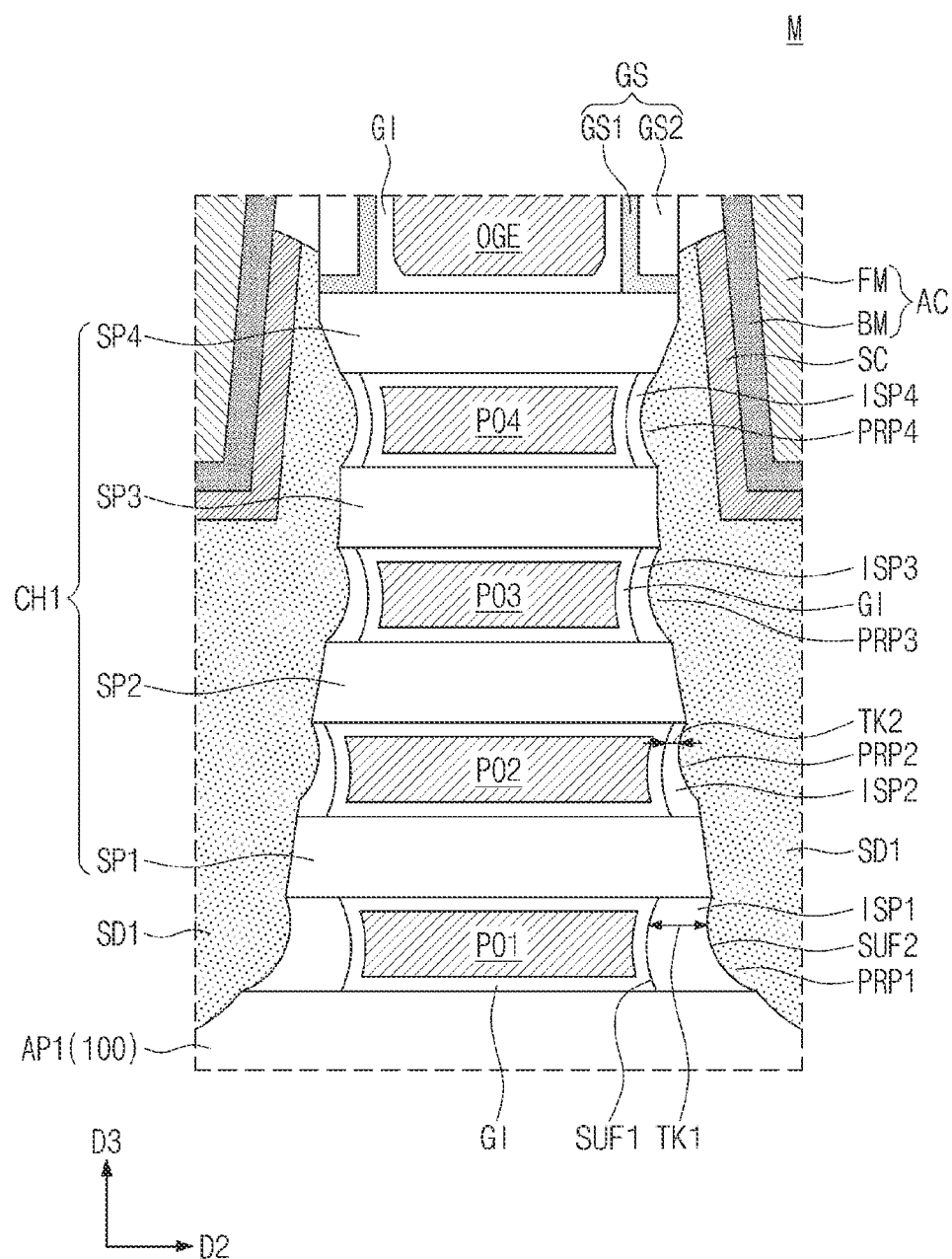
FIGS. 17, 18, and 19 illustrate enlarged views showing an example of a section M depicted in FIG. 5A.
Figure 18:
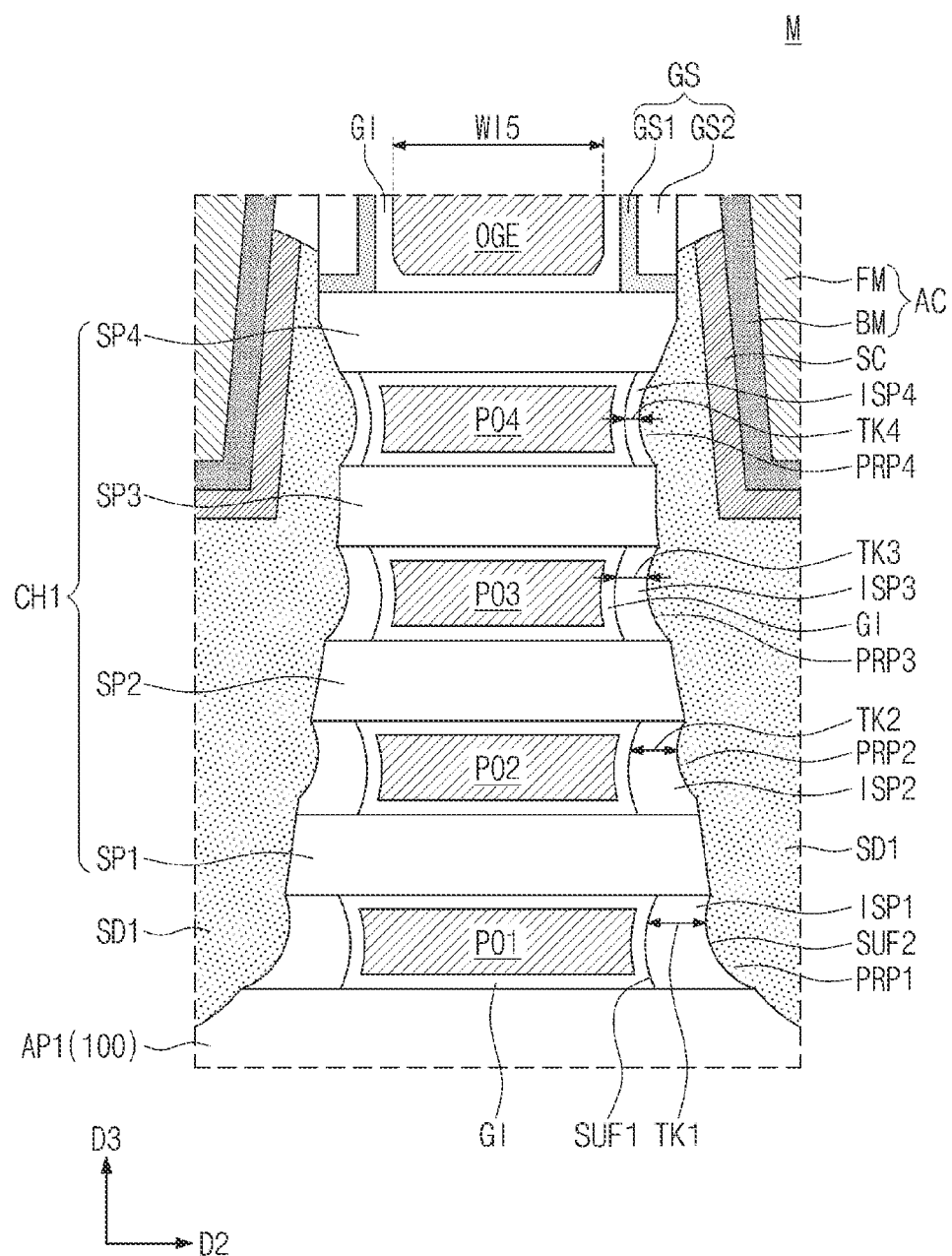
Figure 19:
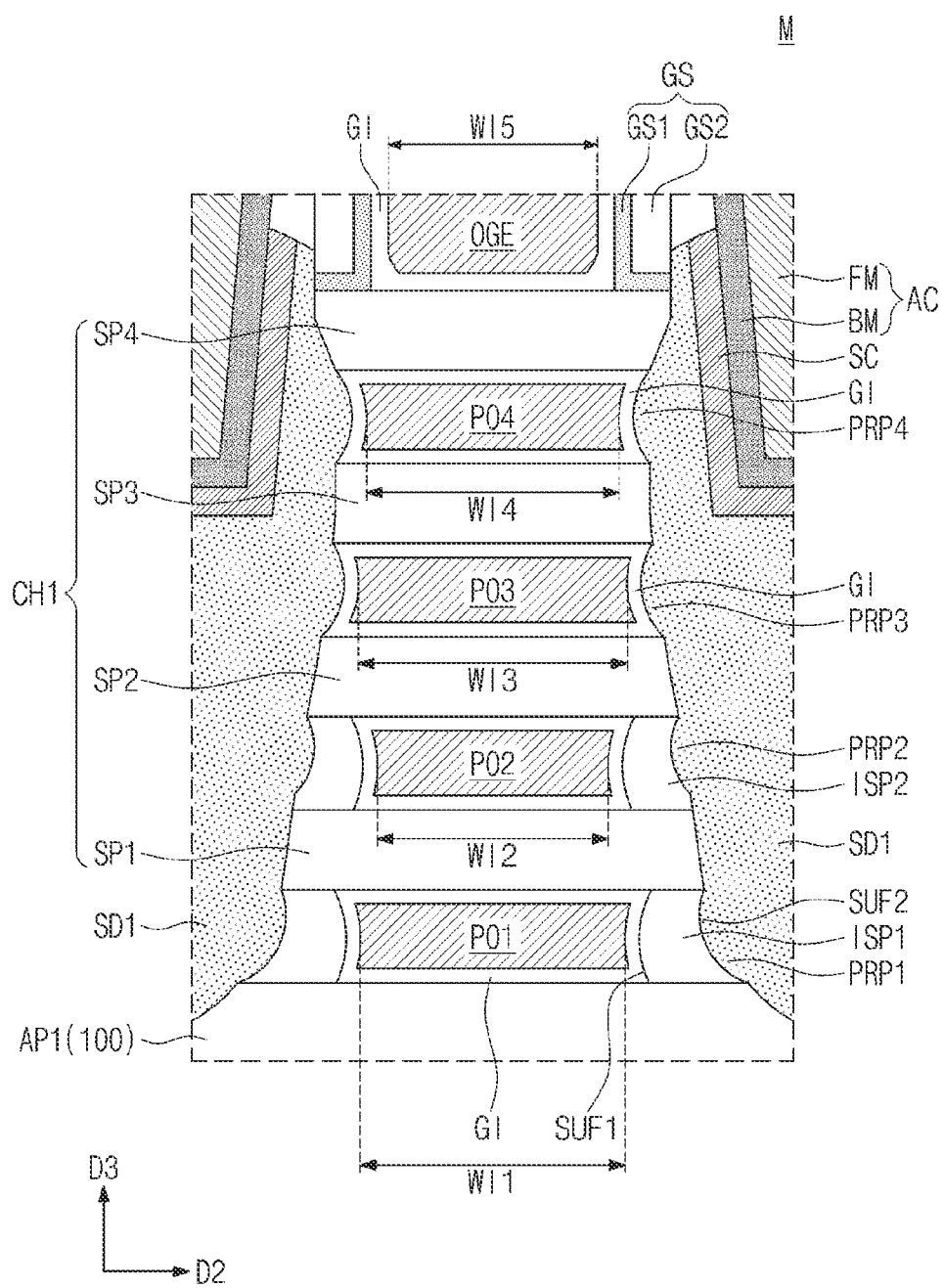

FIGS. 17, 18, and 19 illustrate enlarged views showing an example of a section M depicted in FIG. 5A. In the embodiments that follow, a detailed description of technical features repetitive to those discussed above with reference to FIGS. 1 to 6 will be omitted, and a difference thereof will be discussed in detail.

Referring to FIG. 17, first to fourth inner spacers ISP1 to ISP4 may be respectively interposed between the first to fourth inner electrodes PO1 to PO4 and the first source/drain pattern SD1. The first to fourth inner spacers ISP1 to ISP4 may include the same dielectric material. The first to fourth inner spacers ISP1 to ISP4 may respectively and directly cover or be on first to fourth protrusions PRP1 to PRP4 of the first source/drain pattern SD1.

The first inner spacer ISP1 may have a first thickness TK1 in the second direction D2 (e.g., a first horizontal thickness). For example, second, third, and fourth inner spacers ISP2, ISP3, and ISP4 may have substantially the same thickness. Each of the second, third, and fourth inner spacers ISP2, ISP3, and ISP4 may have a second thickness TK2 in the second direction D2 (e.g., a second horizontal thickness).

In some embodiments of the present inventive concepts, the first thickness TK1 of the first inner spacer ISP1 may be greater than the second thickness TK2 of the second inner spacer ISP2. A ratio TK1/TK2 of the first thickness TK1 to the second thickness TK2 may range from about 3 to about 10. For example, the first thickness TK1 of the first inner spacer ISP1 may be remarkably greater than a thickness TK2 of each of the second, third, and fourth inner spacers ISP2, ISP3, and ISP4.

In the wet etching process performed on the inner dielectric layer ISL discussed above with reference to FIGS. 15 and 16, the inner dielectric layer ISL may also remain in the shallow second, third, and fourth indent regions IDR2, IDR3, and IDR4. Therefore, not only the first inner spacer ISP1 may be formed in the deep first indent region IDR1, but also the second, third, and fourth inner spacers ISP2, ISP3, and ISP4 may be correspondingly or respectively formed in the shallow second, third, and fourth indent regions IDR2, IDR3, and IDR4.

Referring to FIG. 18, the first to fourth inner spacers ISP1 to ISP4 may be respectively interposed between the first to fourth inner electrodes PO1 to PO4 and the first source/drain pattern SD1. Minimum thicknesses in the second direction D2 of the first to fourth inner spacers ISP1 to ISP4 may progressively decrease in a direction from a lower tier to an upper tier.

For example, a minimum thickness TK2 of the second inner spacer ISP2 may be less than a minimum thickness TK1 of the first inner spacer ISP1. A minimum thickness TK3 of the third inner spacer ISP3 may be less than the minimum thickness TK2 of the second inner spacer ISP2. A minimum thickness TK4 of the fourth inner spacer ISP4 may be less than the minimum thickness TK3 of the third inner spacer ISP3.

According to some embodiments, an inner spacer may be formed to have a relatively large thickness at a lower tier in which a wide interval or distance is provided between the first source/drain patterns SD1 and leakage current is frequently produced. An inner spacer may be formed to have a relatively small thickness at an upper tier in which a narrow interval or distance is provided between the first source/drain patterns SD1 and leakage current is slightly produced. As a result, leakage current of a three-dimensional transistor may be prevented and parasitic capacitance of a three-dimensional transistor may be reduced, and thus a device may increase in performance.

Referring to FIG. 19, the first inner spacer ISP1 may be interposed between the first inner electrode PO1 and the first protrusion PRP1 of the first source/drain pattern SD1. The second inner spacer ISP2 may be interposed between the second inner electrode PO2 and the second protrusion PRP2 of the first source/drain pattern SD1. However, no inner spacer may be provided around the third and fourth inner electrodes PO3 and PO4.

For example, differently from that discussed in FIG. 6, not only the first inner spacer ISP1 may be provided around the first inner electrode PO1 at a lowermost tier, but also the second inner spacer ISP2 may be additionally provided around the second inner electrode PO2.

The first inner spacer ISP1 and the second inner spacer ISP2 may have substantially the same thickness. Therefore, the minimum width WI2 of the second inner electrode PO2 may be less than the minimum width WI1 of the first inner electrode PO1. The minimum width WI3 of the third inner electrode PO3 may be greater than the minimum width WI2 of the second inner electrode PO2. The minimum width WI4 of the fourth inner electrode PO4 may be less than the minimum width WI3 of the third inner electrode PO3.

A lowermost sacrificial layer and its overlying sacrificial layer of the stack pattern STP discussed above with reference to FIGS. 7A and 7B may be formed into the reinforced sacrificial layers SALA, which may result in a semiconductor device according to some embodiments.

In a three-dimensional field effect transistor according to some embodiments of the present inventive concepts, an inner spacer may be selectively disposed only in an appropriate one of regions between a source/drain pattern and stacked inner electrodes. Therefore, it may be possible to minimize parasitic capacitance caused by the inner spacer and to use the inner spacer to prevent leakage current. As a result, the present inventive concepts may improve reliability and electrical properties of a semiconductor device.

Although some embodiments of inventive concepts have been discussed with reference to accompanying figures, it will be understood that various changes in form and details may be made therein without departing from the scope of the inventive concepts. It therefore will be understood that the embodiments described above are just illustrative but not limitative in all aspects.

What is claimed is:

1. A semiconductor device, comprising:
   a substrate that comprises an active pattern;
   a channel pattern on the active pattern, the channel pattern comprising a plurality of semiconductor patterns that are spaced apart from and vertically stacked on each other;
   a source/drain pattern electrically connected to the plurality of semiconductor patterns;
   a gate electrode on the plurality of semiconductor patterns, the gate electrode comprising a plurality of electrodes that are respectively below respective ones of the plurality of semiconductor patterns, the plurality of electrodes comprising a lowermost first electrode and a second electrode on the first electrode; and
   a first spacer between the first electrode and the source/drain pattern,
   wherein a horizontal width of the first electrode is less than a horizontal width of the second electrode; and
   wherein the second electrode and the source/drain pattern are free of a spacer therebetween.

2. The semiconductor device of claim 1, wherein the horizontal width of the second electrode is greater than that of remaining ones of the plurality of electrodes other than the second electrode.

3. The semiconductor device of claim 1, further comprising a second spacer,
wherein a horizontal thickness of the second spacer is less than a horizontal thickness of the first spacer.

4. The semiconductor device of claim 1, wherein the plurality of electrodes further comprise a third electrode on the second electrode,
wherein a horizontal width of the third electrode is less than the horizontal width of the second electrode.

5. The semiconductor device of claim 1, wherein remaining ones of the plurality of electrodes other than the first electrode have respective horizontal widths, and
wherein the respective horizontal widths decrease, with respect to one another, with increasing distance from the first electrode.

6. The semiconductor device of claim 1, wherein the plurality of semiconductor patterns comprise between 2 to 10 semiconductor patterns.

7. The semiconductor device of claim 1, further comprising a gate dielectric layer that is on each of the plurality of electrodes,
wherein a portion of the gate dielectric layer that is on the first electrode is in contact with the first spacer, and
wherein a portion of the gate dielectric layer that is on the second electrode is in contact with the source/drain pattern.

8. The semiconductor device of claim 7, wherein the first spacer comprises:
a first side surface in contact with the portion of the gate dielectric layer that is on the first electrode; and
a second side surface opposite to the first side surface, wherein the second side surface is in contact with the source/drain pattern.

9. The semiconductor device of claim 1, wherein the source/drain pattern comprises a plurality of protrusions that respectively protrude toward respective ones of the plurality of electrodes.

10. A semiconductor device, comprising:
a substrate that comprises an active pattern;
a channel pattern on the active pattern, the channel pattern comprising a plurality of semiconductor patterns that are spaced apart from and vertically stacked on each other;
a source/drain pattern electrically connected to the plurality of semiconductor patterns;
a gate electrode on the plurality of semiconductor patterns, the gate electrode comprising a plurality of electrodes that are respectively below respective ones of the plurality of semiconductor patterns;
a gate dielectric layer that is on each of the plurality of electrodes; and
a spacer between the source/drain pattern and a lowermost electrode of the plurality of electrodes,
wherein a portion of the gate dielectric layer that is on remaining ones of the plurality of electrodes other than the lowermost electrode is in contact with the source/drain pattern, and
wherein a portion of the gate dielectric layer that is on the lowermost electrode is in contact with the spacer.

11. The semiconductor device of claim 10, wherein there are no spacers respectively between the source/drain pattern and the remaining ones of the plurality of electrodes other than the lowermost electrode.

12. The semiconductor device of claim 10, wherein the spacer comprises:
a first side surface in contact with the portion of the gate dielectric layer that is on the lowermost electrode; and
a second side surface opposite to the first side surface, wherein the second side surface is in contact with the source/drain pattern.

13. The semiconductor device of claim 10, wherein the remaining ones of the plurality of electrodes other than the lowermost electrode have respective horizontal widths, and
wherein the respective horizontal widths decrease, with respect to one another, with increasing distance from the lowermost electrode.

14. The semiconductor device of claim 10, wherein the source/drain pattern comprises a plurality of protrusions that respectively protrude toward respective ones of the plurality of electrodes.

15. A semiconductor device, comprising:
a substrate that comprises an active region;
a device isolation layer that defines an active pattern on the active region;
a channel pattern and a source/drain pattern on the active pattern, the channel pattern comprising a plurality of semiconductor patterns that are spaced apart from and vertically stacked on each other;
a gate electrode on the plurality of semiconductor patterns, the gate electrode comprising a plurality of inner electrodes that are respectively below respective ones of the plurality of semiconductor patterns and an outer electrode on an uppermost one of the plurality of semiconductor patterns, the plurality of inner electrodes comprising a lowermost first inner electrode and a second inner electrode on the first inner electrode;
a gate dielectric layer between the gate electrode and the respective ones of the plurality of semiconductor patterns;
an inner spacer between the first inner electrode and the source/drain pattern;
a gate spacer on a sidewall of the outer electrode;
a gate capping pattern on a top surface of the outer electrode;
an interlayer dielectric layer on the gate capping pattern;
an active contact that extends into the interlayer dielectric layer and is electrically connected to the source/drain pattern;
a gate contact that extends into the interlayer dielectric layer and the gate capping pattern and is electrically connected to the gate electrode; and
a first metal layer on the interlayer dielectric layer, the first metal layer comprising a power line and first wiring lines, the first wiring lines being electrically connected to the active contact and the gate contact, respectively;
wherein the gate dielectric layer is on each of the plurality of inner electrodes,
wherein a portion of the gate dielectric layer that is on the second inner electrode is in contact with the source/drain pattern, and
wherein a portion of the gate dielectric layer that is on the first inner electrode is in contact with the inner spacer.

16. The semiconductor device of claim 15, wherein the second inner electrode and the source/drain pattern are free of an inner spacer therebetween.

17. The semiconductor device of claim 15, wherein the inner spacer comprises:
a first side surface in contact with the portion of the gate dielectric layer that is on the first inner electrode; and
a second side surface opposite to the first side surface, wherein the second side surface is in contact with the source/drain pattern.

18. The semiconductor device of claim 15, wherein a horizontal width of the first inner electrode is less than a horizontal width of the second inner electrode.

19. The semiconductor device of claim 18, further comprising:
- a metal semiconductor compound layer between the active contact and the source/drain pattern; and
- a second metal layer on the first metal layer,
- wherein the plurality of inner electrodes further comprise a third inner electrode on the second inner electrode, and
- wherein a horizontal width of the third inner electrode is less than the horizontal width of the second inner electrode.

\* \* \* \* \*